US009766295B2

(12) United States Patent
Kokorin et al.

(10) Patent No.: US 9,766,295 B2
(45) Date of Patent: Sep. 19, 2017

(54) COULOMB COUNTING USING ANALOG-TO-FREQUENCY CONVERSION

(71) Applicant: O2Micro Inc., Santa Clara, CA (US)

(72) Inventors: Oleksandr Kokorin, San Jose, CA (US); Laszlo Lipcsei, Campbell, CA (US)

(73) Assignee: O2Micro Inc., Santa Clara, CA (US)

( * ) Notice: Subject to any disclaimer, the term of this patent is extended or adjusted under 35 U.S.C. 154(b) by 283 days.

(21) Appl. No.: 14/482,291

(22) Filed: Sep. 10, 2014

(65) Prior Publication Data

US 2016/0069960 A1 Mar. 10, 2016

(51) Int. Cl.
*G01N 27/416* (2006.01)
*G01R 31/36* (2006.01)
*H03K 7/06* (2006.01)

(52) U.S. Cl.
CPC ........... *G01R 31/3606* (2013.01); *H03K 7/06* (2013.01)

(58) Field of Classification Search
CPC ............................... H02J 7/0078; G01R 19/00
USPC ....................................... 324/426, 428, 76.11
See application file for complete search history.

(56) References Cited

U.S. PATENT DOCUMENTS

| | | | | |
|---|---|---|---|---|
| 4,807,147 A | * | 2/1989 | Halbert | H03M 1/1255 324/76.15 |
| 2011/0313698 A1 | * | 12/2011 | Inoue | G01R 19/14 702/63 |

* cited by examiner

*Primary Examiner* — Richard Isla Rodas
*Assistant Examiner* — Johali Torres Ruiz

(57) ABSTRACT

In an analog-to-frequency converting circuit, a set of switches receive a first sense signal indicative of a current and provides a second sense signal that alternates between an original version of the first sense signal and a reversed version of the first sense signal, under control of a switching signal. An integral comparing circuit integrates the second sense signal to generate an integral value and generates a train of trigger signals. Each trigger signal is generated when the integral value reaches a preset reference. A compensation circuit compensates for the integral value with a predetermined value in response to each trigger signal. A control circuit generates the switching signal such that a time interval during which the second sense signal is the original version and a time interval during which the second sense signal is the reversed version are substantially the same.

17 Claims, 10 Drawing Sheets

COULOMB COUNTING USING ANALOG-TO-FREQUENCY CONVERSION

BACKGROUND

A conventional method for counting charges passing in and out of a battery (referred to as "coulomb counting") includes generating a sense voltage linearly proportional to a current (e.g., a charging current or a discharging current) of the battery, using a voltage-to-frequency converter to convert the sense voltage to a frequency signal linearly proportional to the sense voltage, and counting a number of waves/pulses of the frequency signal to generate a count value. The count value can represent an amount of accumulation of electric charges passing in and out of the battery.

FIG. 1 illustrates a circuit diagram of a conventional voltage-to-frequency converter 100. As shown in FIG. 1, the voltage-to-frequency converter 100 includes a sense resistor $R'_{SEN}$, an integrator (e.g., a combined circuit of a resistor $R'_{INT}$, an integrating capacitor $C'_{INT}$, and an operational amplifier (OPA) 112; hereinafter, integrator ($R'_{INT}$, $C'_{INT}$, 112)), comparators 114 and 116, compensation circuitry (e.g., a combined circuit of capacitors $CP_1$ and $CP_1$, and switches $M_1$-$M_8$), and a control circuit 150.

The sense resistor $R'_{SEN}$ senses a battery current $I'_{BAT}$ of a battery 152 to generate a sense voltage $V'_{SEN}$. The integrator ($R'_{INT}$, $C'_{INT}$, 112) integrates the sense voltage $V'_{SEN}$ to generate an integral result $V'_{INT}$. The integral result $V'_{INT}$ represents an integral value of the sense voltage $V'_{SEN}$, and therefore represents an integral value of the battery current $I'_{BAT}$. The comparators 114 and 116 compare the integral result $V'_{INT}$ with voltage references $V'_H$ and $V'_L$ ($V'_L < V'_H$) to generate a train of pulse signals $CMP'_H$ and $CMP'_L$. The control circuit 150 controls the switches $M_1$-$M_8$ according to the pulse signals $CMP'_H$ and $CMP'_L$. A frequency $f'_{CMP}$ of the pulse signals $CMP'_H$ or $CMP'_L$ represents the battery current $I'_{BAT}$.

By way of example, if the battery 152 is in a charging mode, then the sense voltage $V'_{SEN}$ labeled in FIG. 1 has a positive value, and the integral result $V'_{INT}$ decreases because of integration of the positive sense voltage $V'_{SEN}$. When the integral result $V'_{INT}$ decreases to the voltage reference $V'_L$, the comparator 116 generates a pulse signal $CMP'_L$, and the control circuit 150 turns on a first group of switches $M_1$, $M_4$, $M_6$ and $M_7$, and turns off a second group of switches $M_2$, $M_3$, $M_5$ and $M_8$. Hence, the capacitor $CP_1$ provides an amount of compensation charges $Q'_{REF}$ to the integrating capacitor $C'_{INT}$ through the inverting input terminal 154 of the OPA 112 to increase the integral result $V'_{INT}$, and the capacitor $CP_2$ is charged by the voltage $V'_{REF}$ to store an amount of compensation charges $Q'_{REF}$. The increased integral result $V'_{INT}$ continues to decrease because of the integration of the positive sense voltage $V'_{SEN}$. When the integral result $V'_{INT}$ decreases to the voltage reference $V'_L$, the comparator 116 generates a next pulse signal $CMP'_L$, and the control circuit 150 turns off the first group of switches and turns on the second group of switches. Hence, the capacitor $CP_2$ provides the stored compensation charges $Q'_{REF}$ to the integrating capacitor $C'_{INT}$ through the terminal 154 to increase the integral result $V'_{INT}$, and the capacitor $CP_1$ is charged by the voltage $V'_{REF}$ to store an amount of compensation charges $Q'_{REF}$. Thus, if the battery 152 is in a charging mode, then the control circuit 150 alternately turns on the first group of switches and the second group of switches, and the comparator 116 generates a train of pulse signals $CMP'_L$ at a frequency $f'_{CMP}$ that is linearly proportional to the charging current $I'_{BAT}$. Similarly, if the battery 152 is in a discharging mode, then the control circuit 150 alternately turns a third group of switches $M_1$, $M_2$, $M_7$ and $M_8$ and a fourth group of switches $M_3$, $M_4$, $M_5$ and $M_6$, and the comparator 114 can generate a train of pulse signals $CMP'_H$ at a frequency $f'_{CMP}$ that is linearly proportional to the discharging current $I'_{BAT}$. The frequency $f'_{CMP}$ of the trigger signals $CMP'_H$/$CMP'_L$ can be used for the abovementioned coulomb counting.

However, the voltage-to-frequency converter 100 has some shortcomings. For example, the frequency $f'_{CMP}$ may have error caused by an input voltage offset $V'_{OS}$ of the OPA 112. Thus, a count value obtained by counting a number of the pulse signals $CMP'_H$/$CMP'_L$ may have error caused by the input voltage offset $V'_{OS}$.

Additionally, because the OPA 112 controls its inverting input terminal 154 and its non-inverting input terminal 156 to have the same voltage level, and the inverting input terminal 154 receives either a voltage level of $V'_{REF}$ or a voltage level of $-V'_{REF}$ from the capacitors $CP_1$ and $CP_1$, a voltage level at the non-inverting input terminal 156, which is also a terminal 156 of the sense resistor $R'_{SEN}$, should be neither relatively high nor relatively low compared with the voltage levels $V'_{REF}$ and $-V'_{REF}$. Because the voltage $V'_{REF}$ is relatively small compared with a voltage level at a positive terminal of the battery 152, the voltage level at the terminal 156 of the sense resistor $R'_{SEN}$ should be relatively small. Thus, the sense resistor $R'_{SEN}$ can be placed at the negative terminal of the battery 152 and cannot be placed at the positive terminal of the battery 152. In some situations, it would be beneficial to place the sense resistor $R'_{SEN}$ at the positive terminal of the battery 154. For example, there may be a thermistor (not shown) connected to the negative terminal of the battery 152 to measure temperature of the battery 152, and a sense resistor $R'_{SEN}$ placed at the negative terminal of the battery 152 may cause error in the measurement of the temperature. Placing the sense resistor $R'_{SEN}$ at the positive terminal of the battery 152 can avoid this error.

Moreover, the compensation circuitry in the voltage-to-frequency converter 100 uses two capacitors $CP_1$ and $CP_1$ to provide compensation charges to the integrator ($R'_{INT}$, $C'_{INT}$, 112). It would be beneficial to use one capacitor instead of two capacitors to provide compensation charges, so as to reduce the cost and size of the compensation circuitry.

Furthermore, when the capacitor $CP_1$ provides compensation charges to the integrator ($R'_{INT}$, $C'_{INT}$, 112), the capacitor $CP_1$ attempts to apply a voltage level $V'_{REF}$ or $-V'_{REF}$ to the inverting input terminal 154 of the OPA 112 that is different from a voltage level, e.g., zero volts, at the non-inverting input terminal 156 of the OPA 112. Because the OPA 112 controls the terminals 154 and 156 to have the same voltage level, a relatively big current may be generated by the OPA 112 to flow through the capacitors $C'_{INT}$ and $CP_1$ to discharge the capacitor $CP_1$, so as to reduce the voltage level $V'_{REF}$ or $-V'_{REF}$ of the capacitor $CP_1$ to zero volts relatively quickly. This requires that the OPA 112 has a relatively high sensibility, and is able to generate and sustain a relatively big current. Such an OPA is relatively expensive and consumes relatively high power.

FIG. 2 illustrates a circuit diagram of a conventional coulomb counter 200. The coulomb counter 200 includes a sense resistor $R'_{SEN}$, a counter 262, and a voltage-to-frequency converter. The voltage-to-frequency converter includes switches $S_1$-$S_4$, an integrator (e.g., a combined circuit of a resistor $R'_{INT}$, a capacitor $C'_{INT}$, and an operational amplifier OPA 212; hereinafter, integrator ($R'_{INT}$, $C'_{INT}$, 212)), an RC filter (including a resistor $R_{FLT}$ and a capacitor $R_{FLT}$), comparators 214 and 216, and a control logic & polarity detection module 260.

The sense resistor $R'_{SEN}$ generates a sense voltage $V'_{SEN1}$ indicative of a battery current $I'_{BAT}$. The switches $S_1$-$S_4$ receive the sense voltage $V'_{SEN1}$ and provide a voltage $V'_{SEN2}$ to the integrator ($R'_{INT}$, $C'_{INT}$, 212). The integrator ($R'_{INT}$, $C'_{INT}$, 112) integrates the voltage $V'_{SEN2}$ to generate an integral result $V'_{INT}$. The integral result $V'_{INT}$ ramps up and down alternately, under control of the switches $S_1$-$S_4$. The comparators 214 and 216 compare the integral result $V'_{INT}$ with voltage references $V'_H$ and $V'_L$ ($V'_L < V'_H$) to generate trigger signals $CMP'_H$ and $CMP'_L$, alternately. The module 260 controls the switches $S_1$-$S_4$ according to the trigger signals $CMP'_H$ and $CMP'_L$ such that the voltage $V'_{SEN2}$ alternates between a voltage level of $V'_{SEN1}$ and a voltage level of $-V'_{SEN1}$. A frequency $f'_{CMP}$ at which the trigger signals $CMP'_H$ and $CMP'_L$ alternate represents the battery current $I'_{BAT}$. The counter 262 counts a number of the trigger signals $CMP'_H$ and $CMP'_L$ to generate a count value representing an amount of accumulation of electric charges in the battery current $I'_{BAT}$.

By way of example, in a situation when the battery current $I'_{BAT}$ flows through the sense resistor $R'_{SEN}$ from the terminal labeled "CS+" to the terminal labeled "CS−," the sense voltage $V'_{SEN1}$ labeled in FIG. 2 has a positive value. The module 260 can turn on the switches $S_1$ and $S_4$ and turn off the switches $S_2$ and $S_3$, and therefore the integrator ($R'_{INT}$, $C'_{INT}$, 212) integrates the voltage level of $V'_{SEN1}$ to decrease the integral result $V'_{INT}$. When the integral result $V'_{INT}$ decreases to the voltage reference $V'_L$, the comparator 216 generates a trigger signal $CMP'_L$, and the module 260 turns off the switches $S_1$ and $S_4$ and turns on the switches $S_2$ and $S_3$ in response to the trigger signal $CMP'_L$. Hence, the integrator ($R'_{INT}$, $C'_{INT}$, 212) integrates the voltage level of $-V'_{SEN1}$ to increase the integral result $V'_{INT}$. When the integral result $V'_{INT}$ increases to the voltage reference $V'_H$, the comparator 214 generates a trigger signal $CMP'_H$, and the module 260 turns on the switches $S_1$ and $S_4$ and turns off the switches $S_2$ and $S_3$ in response to the trigger signal $CMP'_H$. Thus, by alternately turning on the pair of switches $S_1$ and $S_4$ and the pair of switches $S_2$ and $S_3$ according to the trigger signals $CMP'_H$ and $CMP'_L$, the coulomb counter 200 alternately generates the trigger signals $CMP'_H$ and $CMP'_L$ at an alternation frequency $f_{CMP}$ that is linearly proportional to the battery current $I'_{BAT}$. Similarly, when the battery current $I'_{BAT}$ flows through the sense resistor $R'_{SEN}$ from the terminal labeled "CS−" to the terminal labeled "CS+," the coulomb counter 200 can also alternately generate trigger signals $CMP'_H$ and $CMP'_L$ at an alternation frequency $f_{CMP}$ that is linearly proportional to the battery current $I'_{BAT}$. The alternation frequency $f_{CMP}$ can be used for coulomb counting.

However, the coulomb counter 200 has some shortcomings. For example, in a first time interval, the integrator ($R'_{INT}$, $C'_{INT}$, 212) can integrate a voltage level of $V'_{SEN1}$ so that the integral result $V'_{INT}$ decreases from the voltage reference $V'_H$ to the voltage reference $V'_L$; and in a second time interval, the integrator ($R'_{INT}$, $C'_{INT}$, 212) can integrate a voltage level of $-V'_{SEN1}$ so that the integral result $V'_{INT}$ increases from the voltage reference $V'_L$ to the voltage reference $V'_H$. The OPA 212 may have an input voltage offset $V'_{OS}$, which causes a time difference between the first and second time intervals. Consequently, the alternation frequency $f_{CMP}$ of the trigger signals $CMP'_H$ and $CMP'_L$ may have error caused by an integration of the voltage offset $V'_{OS}$ based on the time difference. A count value obtained by counting a number of the trigger signals $CMP'_H$/$CMP'_L$ may have error caused by the input voltage offset $V'_{OS}$.

Additionally, due to non-ideality of the comparators 214 and 216, there may be time delays in generation of the trigger signals $CMP'_H$ and $CMP'_L$. This may result in error, e.g., a decrement, in the alternation frequency $f_{CMP}$ of the trigger signals $CMP'_H$ and $CMP'_L$. Comparators with relatively fast response speed may be used to reduce the error in the alternation frequency $f_{CMP}$. However, such comparators may be relatively expensive and consume relatively high power.

A coulomb counter that addresses the abovementioned shortcomings would be beneficial.

SUMMARY

In one embodiment, an analog-to-frequency converting circuit includes a set of switches, an integral comparing circuit, a compensation circuit, and a control circuit. The switches receive a first sense signal indicative of a current and provide a second sense signal that alternates between an original version of the first sense signal and a reversed version of the first sense signal, under control of a switching signal. The integral comparing circuit integrates the second sense signal to generate an integral value and generates a train of trigger signals at a frequency indicative of the current. Each trigger signal of the trigger signals is generated when the integral value reaches a preset reference. The compensation circuit compensates for the integral value with a predetermined value in response to each trigger signal of the trigger signals. The control circuit generates the switching signal such that a first time interval during which the second sense signal is the original version and a second time interval during which the second sense signal is the reversed version are substantially the same.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments according to the present invention provide solutions to convert an analog signal, e.g., a current signal or a voltage signal, to a frequency signal indicative of, e.g., linearly proportional to, the analog signal. The frequency signal can be used for coulomb counting.

Figure 3:
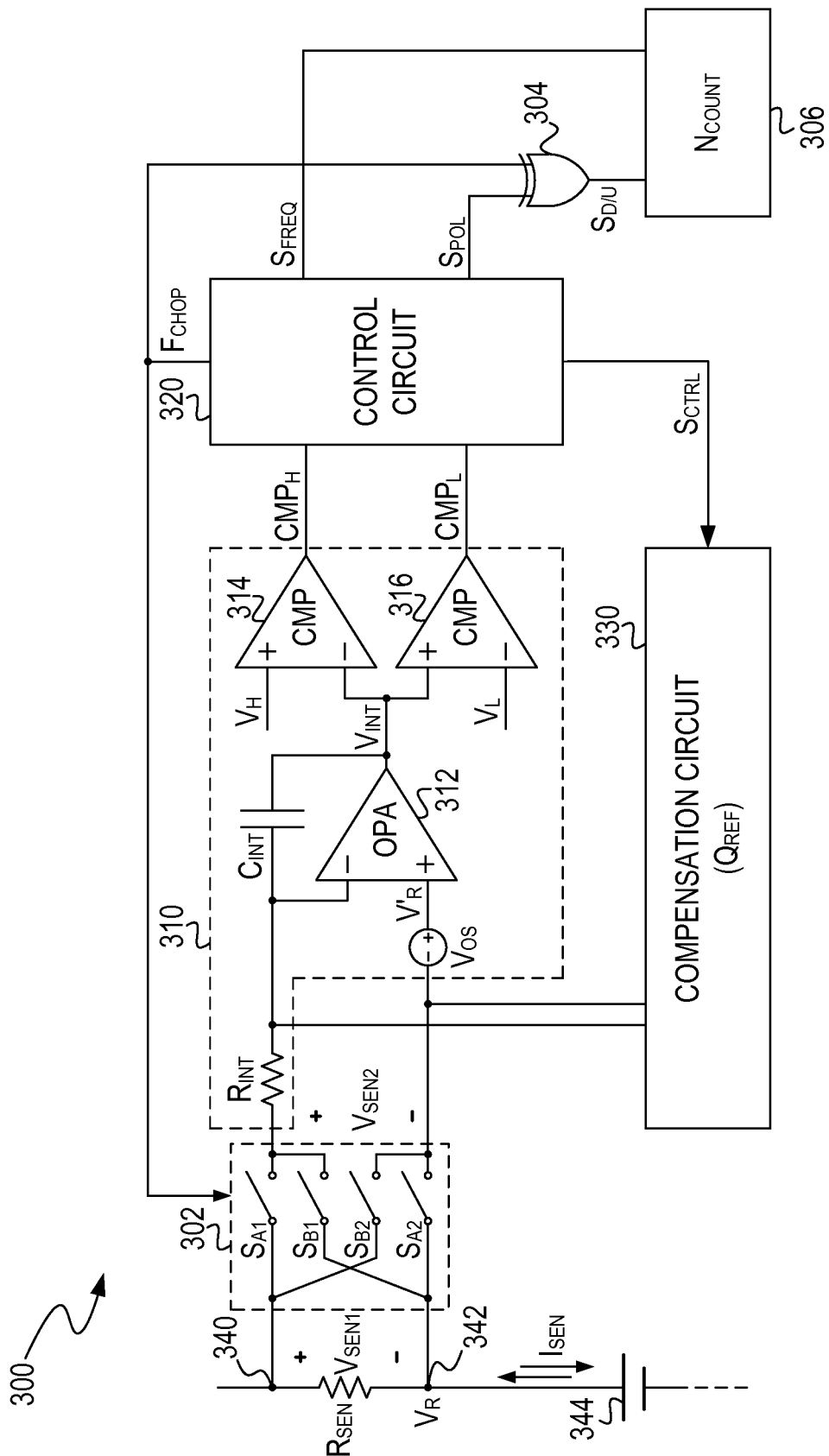
FIG. 3 illustrates a circuit diagram of an example of a coulomb counter, in an embodiment according to the present invention.

FIG. 3 illustrates a circuit diagram of an example of a coulomb counter 300, in an embodiment according to the present invention. In one embodiment, the coulomb counter 300 includes an analog-to-frequency converting circuit, a logic circuit 304, and a counter 306. The analog-to-frequency converter can include a sense resistor $R_{SEN}$, a set of switches 302, an integral comparing circuit 310, a control circuit 320, and a compensation circuit 330.

In one embodiment, the analog-to-frequency converting circuit converts an analog signal (e.g., a current $I_{SEN}$ flowing through the sense resistor $R_{SEN}$, a first sense voltage $V_{SEN1}$ across the sense resistor $R_{SEN}$, or a second sense voltage $V_{SEN2}$ input to the integral comparing circuit 310) to a frequency signal such as a train of trigger signals $S_{FREQ}$ (e.g., a series of rising edges or a series of falling edges) at a frequency $f_{CMP}$ indicative of (e.g., linearly proportional to) the analog signal. The counter 306 can count a number of the trigger signals $S_{FREQ}$ (e.g., rising edges or falling edges) to generate a count value $N_{COUNT}$. The count value $N_{COUNT}$ can represent a result of integrating the analog signal. In one embodiment, the analog signal includes a current $I_{SEN}$ of a battery 344. In one such embodiment, the count value $N_{COUNT}$ obtained by counting the trigger signals $S_{FREQ}$ can represent an amount of accumulation of electric charges in the current $I_{SEN}$, e.g., an amount of accumulation of electric charges passing in and out of the battery 344.

More specifically, in the analog-to-frequency converting circuit in one embodiment, the sense resistor $R_{SEN}$ senses a current $I_{SEN}$ flowing through the sense resistor $R_{SEN}$, and generates a first sense signal $V_{SEN1}$, e.g., a voltage signal, indicative of the current $I_{SEN}$. The switches 302 receive the sense signal $V_{SEN1}$ and provide a second sense signal $V_{SEN2}$, e.g., a voltage signal, that alternates between an original version of the sense signal $V_{SEN1}$ (e.g., $V_{SEN2}=V_{SEN1}$) and a reversed version of the sense signal $V_{SEN1}$ (e.g., $V_{SEN2}=-V_{SEN1}$), under control of a switching signal $F_{CHOP}$. The integral comparing circuit 310 integrates the sense signal $V_{SEN2}$ to generate an integral value $V_{INT}$ of the sense signal $V_{SEN2}$. The integral value $V_{INT}$ may increase or decrease depending on whether the sense signal $V_{SEN2}$ is the original version of $V_{SEN1}$ or the reversed version of $V_{SEN1}$. The integral comparing circuit 310 also compares the integral value $V_{INT}$ with preset references $V_H$ and $V_L$ ($V_L < V_H$) and generates a train of trigger signals $CMP_H$ and $CMP_L$ at a frequency $f_{CMP}$ indicative of the current $I_{SEN}$. In one embodiment, the abovementioned trigger signals $S_{FREQ}$ include the trigger signals $CMP_H$ and $CMP_L$. Each trigger signal of the trigger signals $CMP_H$ and $CMP_L$ is generated when the integral value $V_{INT}$ of the sense signal $V_{SEN2}$ reaches a preset reference $V_H$ or $V_L$. In one embodiment, a trigger signal $CMP_H$ represents that the integral value $V_{INT}$ has increased to the preset reference $V_H$, and a trigger signal $CMP_L$ represents that the integral value $V_{INT}$ has decreased to the preset reference $V_L$. The compensation circuit 330 can compensate, e.g., decrease, the integral value $V_{INT}$ with a predetermined value in response to each trigger signal $CMP_H$ such that a train of trigger signals $CMP_H$ are generated. Similarly, the compensation circuit 330 can compensate, e.g., increase, the integral value $V_{INT}$ with a predetermined value in response to each trigger signal $CMP_L$ such that a train of trigger signals $CMP_L$ are generated. The control circuit 320 can generate the switching signal $F_{CHOP}$ such that a first time interval $T_A$ during which the sense signal $V_{SEN2}$ is in the original version of the sense signal $V_{SEN1}$ (e.g., $V_{SEN2}=V_{SEN1}$) and a second time interval $T_B$ during which the sense signal $V_{SEN2}$ is in the reversed version of the sense signal $V_{SEN1}$ (e.g., $V_{SEN2}=-V_{SEN1}$) are substantially the same.

By way of example, the switches 302 include switches $S_{A1}$, $S_{A2}$, $S_{B1}$ and $S_{B2}$. The switching signal $F_{CHOP}$ can turn off the switches $S_{B1}$ and $S_{B2}$ and turn on the switches $S_{A1}$ and $S_{A2}$ so that the sense signal $V_{SEN2}$ is in an original version of the sense signal $V_{SEN1}$, e.g., $V_{SEN2}=V_{SEN1}$. The switching signal $F_{CHOP}$ can also turn off the switches $S_{A1}$ and $S_{A2}$ and turn on the switches $S_{B1}$ and $S_{B2}$ so that the sense signal $V_{SEN2}$ is in a reversed version of the sense signal $V_{SEN1}$, e.g., $V_{SEN2}=-V_{SEN1}$.

The integral comparing circuit 310 can include an integrator (e.g., a combined circuit of an integrating resistor $R_{INT}$, an integrating capacitor $C_{INT}$, and an operational amplifier (OPA) 312; hereinafter, integrator ($R_{INT}$, $C_{INT}$, 312)) and comparator circuitry (e.g., including comparators 314 and 316; hereinafter, comparator circuitry 314-316). The integrator ($R_{INT}$, $C_{INT}$, 312) integrates the sense signal $V_{SEN2}$ and generates an integral value $V_{INT}$ of the sense signal $V_{SEN2}$. The integral value $V_{INT}$ can be given by:

$$V_{INT} = \frac{1}{R_{INT}C_{INT}} \int (V_{OS} - V_{SEN2})dt + V'_R,$$

where, $R_{INT}$ represents the resistance of the integrating resistor $R_{INT}$, $C_{INT}$ represents the capacitance of the integrating capacitor $C_{INT}$, $V_{OS}$ represents an input offset of the OPA 312, $V_{SEN2}$ represents a voltage level of the sense signal $V_{SEN2}$, and $V'_R$ represents a voltage level at the non-inverting input terminal of the OPA 312. Hence, the integral value $V_{INT}$ decreases if the sense signal $V_{SEN2}$ is positive, and increases if the sense signal $V_{SEN2}$ is negative. The comparator circuitry 314-316 compares the integral value $V_{INT}$ with a high-side reference $V_H$ and a low-side reference $V_L$ that is less than the high-side reference $V_H$, generates a trigger signal $CMP_H$ if the integral value $V_{INT}$ is greater than the high-side reference $V_H$, and generates a trigger signal $CMP_L$ if the integral value $V_{INT}$ is less than the low-side reference $V_L$. In the example of FIG. 3, the trigger signals $CMP_H$ and $CMP_L$ are logic-low signals (e.g., falling edges of signals). However, the invention is not so limited. In another embodiment, the comparator circuitry is in another structure, and the trigger signals $CMP_H$ and $CMP_L$ can be logic-high signals (e.g., rising edges of signals) or a combination of a logic-high signal and a logic-low signal.

The control circuit 320 can receive the trigger signals $CMP_H$ and $CMP_L$ and generate one or more control signals $S_{CTRL}$ to control the compensation circuit 330 according to the trigger signals $CMP_H$ and $CMP_L$, so as to control a frequency $f_{CMP}$ of the trigger signals $CMP_H/CMP_L$ to be indicative of (e.g., linearly proportional to) the sense signal $V_{SEN2}$. More specifically, in one embodiment, the compensation circuit 330 can provide compensation charges to the integral comparing circuit 310 such that positive charges pass through the integrating capacitor $C_{INT}$ from the inverting input terminal of the OPA 312 to the output terminal of the OPA 312, and therefore the integral value $V_{INT}$ decreases. Such compensation charges can be referred to as "positive compensation charges." The compensation circuit 330 can also provide compensation charges to the integral comparing circuit 310 such that positive charges pass through the integrating capacitor $C_{INT}$ from the output terminal of the OPA 312 to the inverting input terminal of the OPA 312, and therefore the integral value $V_{INT}$ increases. Such compensation charges can be referred to as "negative compensation charges." In one embodiment, if a trigger signal $CMP_H$ is generated from the comparator 314, e.g., indicating that the integral value $V_{INT}$ increases to the high-side reference $V_H$, then the control circuit 320 controls the compensation circuit 330 to provide positive compensation charges in a predetermined amount $Q_{REF}$ to the integrating capacitor $C_{INT}$, so as to decrease the integral value $V_{INT}$ by a predetermined value $\Delta V_{INT}$. The predetermined value $\Delta V_{INT}$ can be determined by the value of $Q_{REF}/C_{INT}$. After it is decreased, the decreased integral value $V_{INT}$ may continue to increase because of the integration of the sense signal $V_{SEN2}$. When the integral value $V_{INT}$ increases to the high-side reference $V_H$, the compensation circuit 330 provides positive compensation charges $Q_{REF}$ to the integrating capacitor $C_{INT}$ again, so as to again decease the integral value $V_{INT}$ by the predetermined value $\Delta V_{INT}$. By compensating the integrating capacitor $C_{INT}$ with the same amount of electric charges $Q_{REF}$ each time the integral value $V_{INT}$ increases to the high-side reference $V_H$, the integral value $V_{INT}$ can ramp up and down alternately, and the integral comparing circuit 310 can generate a train of trigger signals $CMP_H$ at a frequency $f_{CMP}$ linearly proportional to the sense signal $V_{SEN2}$, e.g., linearly proportional to the current $I_{SEN}$. Similarly, if a trigger signal $CMP_L$ is generated from the comparator 316, e.g., indicating that the integral value $V_{INT}$ decreases to the low-side reference $V_L$, then the control circuit 320 controls the compensation circuit 330 to provide negative compensation charges in the predetermined amount $Q_{REF}$ to the integrating capacitor $C_{INT}$, so as to increase the integral value $V_{INT}$ by a predetermined value $\Delta V_{INT}$. The predetermined value $\Delta V_{INT}$ can be determined by the value of $Q_{REF}/C_{INT}$. The compensation circuit 330 can compensate the integrating capacitor $C_{INT}$ with the same amount of electric charges $Q_{REF}$ to increase the integral value $V_{INT}$ each time the integral value $V_{INT}$ decreases to the low-side reference $V_L$. Hence, the integral comparing circuit 310 can generate a train of trigger signals $CMP_L$ at a frequency $f_{CMP}$ linearly proportional to the sense signal $V_{SEN2}$, e.g., linearly proportional to the current $I_{SEN}$.

Figure 4:
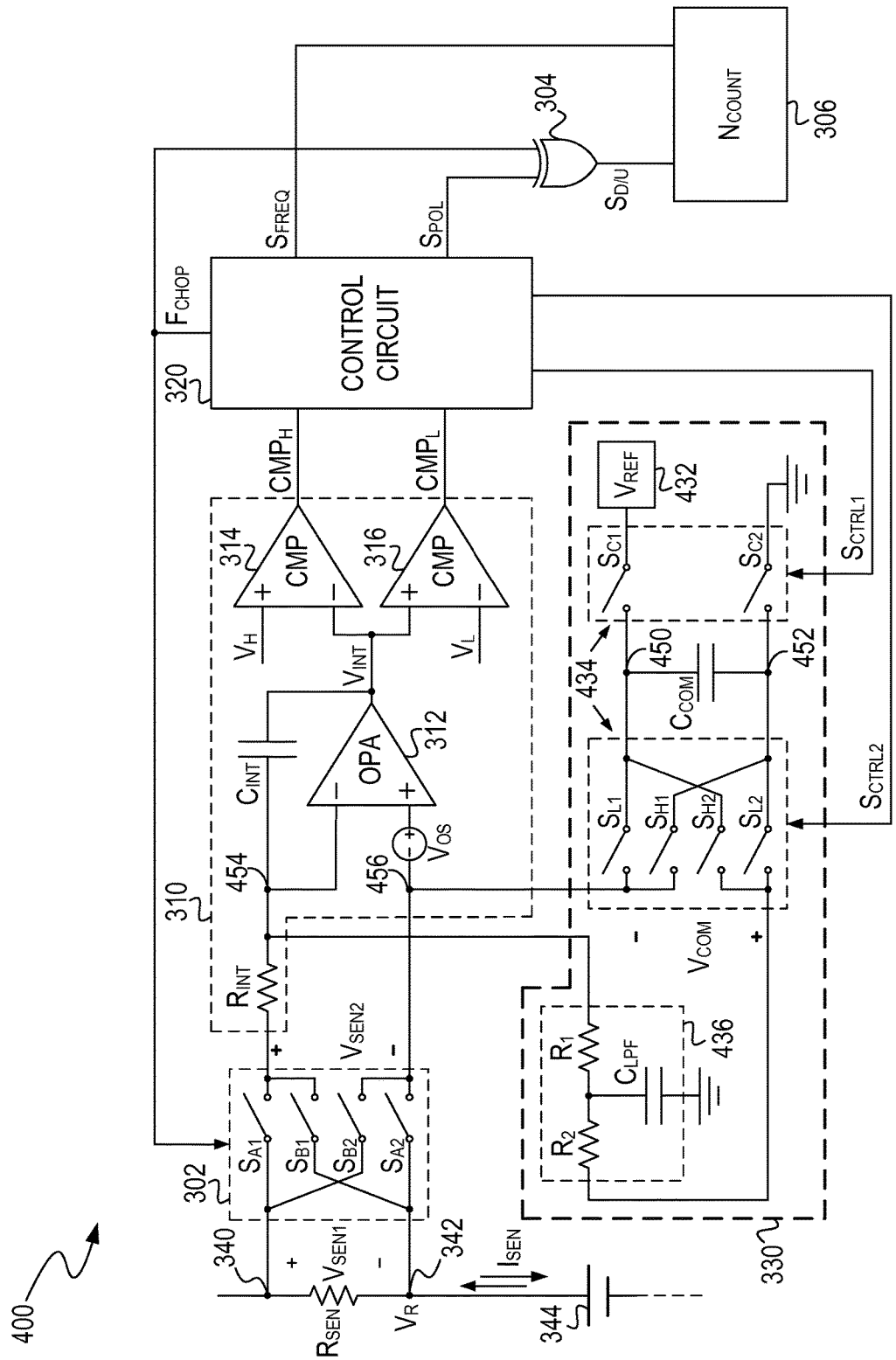
FIG. 4 illustrates a circuit diagram of an example of a coulomb counter, in an embodiment according to the present invention.

FIG. 4 illustrates a circuit diagram of an example of a compensation circuit 330 in a coulomb counter 400, in an embodiment according to the present invention. In one embodiment, the compensation circuit 330 described in relation to FIG. 3 has the circuit structure of the compensation circuit 330 disclosed in FIG. 4.

As shown in FIG. 4, the compensation circuit 330 includes a capacitive component $C_{COM}$, e.g., a compensation capacitor, a set of switches 434, e.g., including switches $S_{L1}$, $S_{L2}$, $S_{H1}$, $S_{H2}$, $S_{C1}$ and $S_{C2}$, and a voltage source 432. The capacitive component $C_{COM}$ can be used to store and provide the abovementioned compensation charges $Q_{REF}$. Under control of the control circuit 320, the switches 434 can selectively connect the voltage source 432 to the capacitive component $C_{COM}$ to charge the capacitive component $C_{COM}$ so that the capacitive component $C_{COM}$ has a voltage level $V_{REF}$ of the voltage source 432. The switches 434 can also selectively connect the capacitive component $C_{COM}$ to the integral comparing circuit 310 so that the compensation circuit 330 provides a compensation signal $V_{COM}$ to compensate, e.g., increase or decrease, the integral value $V_{INT}$. By way of example, the voltage source 432 provides a reference voltage $V_{REF}$. The control circuit 320 can generate control signals $S_{CTRL1}$ and $S_{CTRL2}$ to turn on the switches $S_{C1}$ and $S_{C2}$ and turn off the switches $S_{L1}$, $S_{L2}$, $S_{H1}$ and $S_{H1}$, so that the capacitive component $C_{COM}$ is charged to have a voltage level of $V_{REF}$. The capacitive component $C_{COM}$ can store an amount of compensation charges $Q_{REF}$ that is given by: $Q_{REF} = V_{REF} * C_{COM}$. The control circuit 320 can also generate control signals $S_{CTRL1}$ and $S_{CTRL2}$ to turn off the switches $S_{C1}$ and $S_{C2}$ and turn on the switches $S_{H1}$ and $S_{H2}$ or the switches $S_{L1}$ and $S_{L2}$, and therefore the two terminals of the capacitive component $C_{COM}$ are coupled to the two input terminals of the OPA 312 respectively. In one embodiment, because the OPA 312 controls its two input terminals to have the same voltage level, which results in controlling a voltage across the capacitive component $C_{COM}$ to be zero volts, the capacitive component $C_{COM}$ can discharge compensation charges $Q_{REF}$ to the integral comparing circuit 310. As shown in FIG. 4, when the switches $S_{H1}$ and $S_{H2}$ are on and the switches $S_L$ and $S_{L2}$ are off, the compensation signal $V_{COM}$ provided to the integral comparing circuit 310 is at a voltage level of $V_{REF}$, e.g., a positive level, and therefore the compensation circuit 330 provides positive compensation charges $Q_{REF}$ to the integrating capacitor $C_{INT}$ to decrease the integral value $V_{INT}$. When the switches $S_{L1}$ and $S_{L2}$ are on and the switches $S_{H1}$ and $S_{H2}$ are off, the compensation signal $V_{COM}$ provided to the integral comparing circuit 310 is at a voltage level of $-V_{REF}$, e.g., a negative level, and therefore the compensation circuit 330 provides negative compensation charges $Q_{REF}$ to the integrating capacitor $C_{INT}$ to increase the integral value $V_{INT}$.

In one embodiment, the control circuit 320 controls the switches 434 according to the trigger signals $CMP_H$ and $CMP_L$ such that the compensation signal $V_{COM}$ is selectively at the voltage level $V_{REF}$ and a reversed level $-V_{REF}$ of the voltage level $V_{REF}$. For example, as mentioned above, the capacitive component $C_{COM}$ can be charged to have the voltage level $V_{REF}$ when the switches $S_{C1}$ and $S_{C2}$ are on and the switches $S_{L1}$, $S_{L2}$, $S_{H1}$ and $S_{H2}$ are off. If the control circuit 320 detects that a trigger signal $CMP_H$ is generated, e.g., indicating that the integral value $V_{INT}$ increases to the high-side reference $V_H$, then the control circuit 320 turns off the switches $S_{C1}$ and $S_{C2}$, turns on the switches $S_{H1}$ and $S_{H2}$, and maintain the switches $S_{L1}$ and $S_{L2}$ off. Hence, the compensation circuit 330 provides a compensation signal $V_{COM}$ at the voltage level $V_{REF}$ to the integral comparing circuit 310 to decrease the integral value $V_{INT}$. For another example, the capacitive component $C_{COM}$ can be charged to have a voltage level of $V_{REF}$ when the switches $S_{C1}$ and $S_{C2}$ are on and the switches $S_{L1}$, $S_{L2}$, $S_{H1}$ and $S_{H2}$ are off. If the control circuit 320 detects that a trigger signal $CMP_L$ is generated, e.g., indicating that the integral value $V_{INT}$ decreases to the low-side reference $V_L$, then the control circuit 320 turns off the switches $S_{C1}$ and $S_{C2}$, turns on the switches $S_{L1}$ and $S_{L2}$, and maintain the switches $S_{H1}$ and $S_{H2}$ off. Hence, the compensation circuit 330 provides a compensation signal $V_{COM}$ at the voltage level $-V_{REF}$ to the integral comparing circuit 310 to increase the integral value $V_{INT}$.

In one embodiment, the compensation circuit 330 also include a filter circuit 436 such as a low-pass filter. The filter circuit 436 can be implemented in many different circuit structures, and FIG. 4 shows an example thereof. In the example of FIG. 4, the filter circuit 436 includes resistors $R_1$ and $R_2$ and a capacitor $C_{LPF}$. The filter circuit 436 can pass the compensation charges $Q_{REF}$ from the compensation circuit 330 to the integral comparing circuit 310 to change the integral value $V_{INT}$. The filter circuit 436 can also buff, e.g., slow down, the flowing of the compensation charges $Q_{REF}$ from the capacitive component $C_{COM}$ to the integral comparing circuit 310, so as to reduce/smoothen the change in the integral value $V_{INT}$ caused by the compensation charges $Q_{REF}$. More details are described in combination with FIG. 5A and FIG. 5B.

Figure 5A:
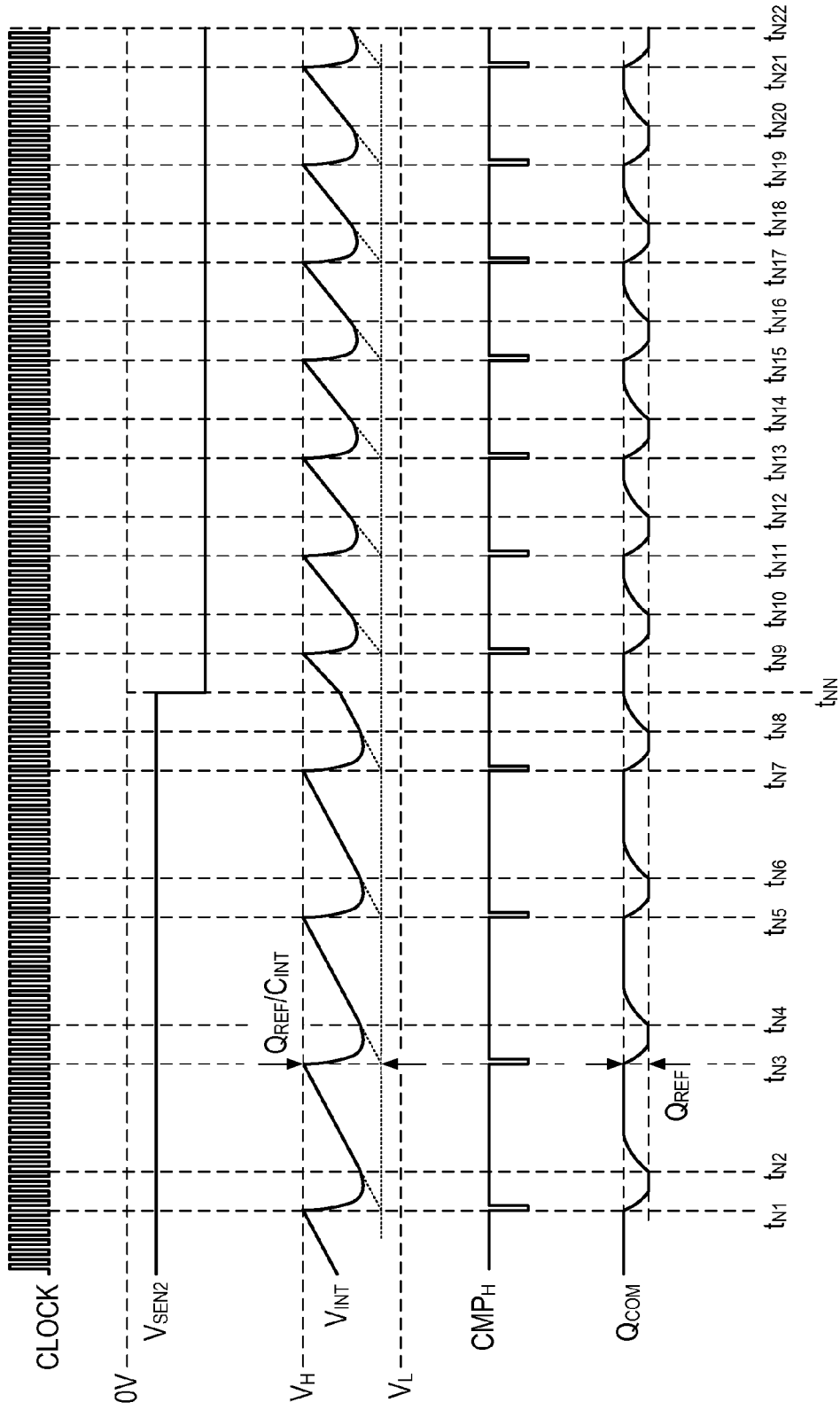
FIG. 5A illustrates examples of waveforms of signals associated with a coulomb counter, in an embodiment according to the present invention.

FIG. 5A illustrates examples of waveforms of the sense signal $V_{SEN2}$, the integral value $V_{INT}$, the trigger signal $CMP_H$, and a charge capacity $Q_{COM}$ of the capacitive component $C_{COM}$, in an embodiment according to the present invention. FIG. 5A is described in combination with FIG. 3 and FIG. 4.

In the example of FIG. 5A, the sense signal $V_{SEN2}$ has a negative voltage level, and the integral value $V_{INT}$ increases due to integration of the negative sense signal $V_{SEN2}$. At time $t_{N1}$, the integral value $V_{INT}$ increases to the high-side reference $V_H$, and a trigger signal $CMP_H$ (e.g., a falling edge of a signal) is generated. Hence, the control circuit 320 turns on the switches $S_{H1}$ and $S_{H2}$ and turns off the switches $S_{L1}$, $S_{L2}$, $S_{C1}$ and $S_{C2}$ so that the capacitive component $C_{COM}$ discharges an amount of the compensation charges $Q_{REF}$ to the integrating capacitor $C_{INT}$ to decrease the integral value $V_{INT}$ by a decrement $\Delta V_{INT}$. In one embodiment, the decrement $\Delta V_{INT}$ can be considered to be $Q_{REF}/C_{INT}$, where $Q_{REF}$ represents the amount of compensation charges provided to the integrating capacitor $C_{INT}$, and $C_{INT}$ represents the capacitance of the integrating capacitor $C_{INT}$. In other words, as shown in FIG. 5A, at time $t_{N1}$, the integral value $V_{INT}$ can be considered to decrease to the voltage level of $V_H-Q_{REF}/C_{INT}$, and then linearly increases from the voltage level of $V_H-Q_{REF}/C_{INT}$ toward the high-side reference $V_H$. In one embodiment, because the filter circuit 436 such as a low-pass filter can reduce/smoothen the change in the integral value $V_{INT}$ caused by the compensation charges $Q_{REF}$, the integral value $V_{INT}$ does not decrease to the voltage level of $V_H-Q_{REF}/C_{INT}$ in practice. However, because the change in the charge capacity of the integrating capacitor $C_{INT}$ caused by the compensation charges $Q_{REF}$ is equal to $Q_{REF}$, the change in a voltage across the integrating capacitor $C_{INT}$, e.g., the change in the integral value $V_{INT}$, caused by the compensation charges $Q_{REF}$ can be considered to be equal to $Q_{REF}/C_{INT}$.

Between time $t_{N1}$ and time $t_{N2}$, the charge capacity $Q_{COM}$ of the capacitive component $C_{COM}$ decreases to zero because the two terminals of the capacitive component $C_{COM}$, coupled to the two input terminals of the OPA 312 respectively, are controlled to have the same voltage level by the OPA 312. At time $t_{N2}$, the control circuit 320 turns on the switches $S_{C1}$ and $S_{C2}$ and turns off the switches $S_{H1}$, $S_{H2}$, $S_{L1}$ and $S_{L2}$ so that the capacitive component $C_{COM}$ is charged by the voltage source 432 and the charge capacity $Q_{COM}$ of the capacitive component $C_{COM}$ increases to $Q_{REF}$, e.g., $Q_{REF}=V_{REF}*C_{COM}$.

As shown in FIG. 5A, a trigger signal $CMP_H$ is generated each time the integral value $V_{INT}$ increases to the high-side reference $V_H$. In response to each trigger signal $CMP_H$, the capacitive component $C_{COM}$ discharges to provide an amount of compensation charges $Q_{REF}$ to the integrating capacitor $C_{INT}$ to decrease the integral value $V_{INT}$ by a decrement $\Delta V_{INT}$, e.g., $\Delta V_{INT}=Q_{REF}/C_{INT}$. The charge capacity $Q_{COM}$ of the capacitive component $C_{COM}$ can decrease to zero. After a preset time interval $\Delta t$ from the generation of each trigger signal $CMP_H$, e.g., $\Delta t=t_{N2}-t_{N1}=t_{N4}-t_{N3}=t_{N6}-t_{N5} \ldots$, the capacitive component $C_{COM}$ is charged by the voltage source 432. The charge capacity $Q_{COM}$ of the capacitive component $C_{COM}$ can increase to $Q_{REF}$. Thus, in one embodiment, each time the integral value $V_{INT}$ increases to the high-side reference $V_H$, the compensation circuit 330 provides the same amount of compensation charges $Q_{REF}$ to the integrating capacitor $C_{INT}$ to decrease the integral value $V_{INT}$, e.g., by the same decrement $Q_{REF}/C_{INT}$. In one embodiment, an integration time $T_{INT}$, e.g., $t_{N3}-t_{N1}$, $t_{N5}-t_{N3}$, etc., for integrating the sense signal $V_{SEN2}$ so that the integral value $V_{INT}$ increases from the voltage level $V_H-Q_{REF}/C_{INT}$ to the voltage level $V_H$ can be given by: $T_{INT}=Q_{REF}*R_{INT}/V_{SEN2}$. Thus, the integration time $T_{INT}$ is inversely proportional to the sense signal $V_{SEN2}$. In other words, the trigger signals $CMP_H$ are generated at a frequency $f_{CMP}$ (e.g., $1/T_{INT}$) that is linearly proportional to the sense signal $V_{SEN2}$.

Figure 5B:
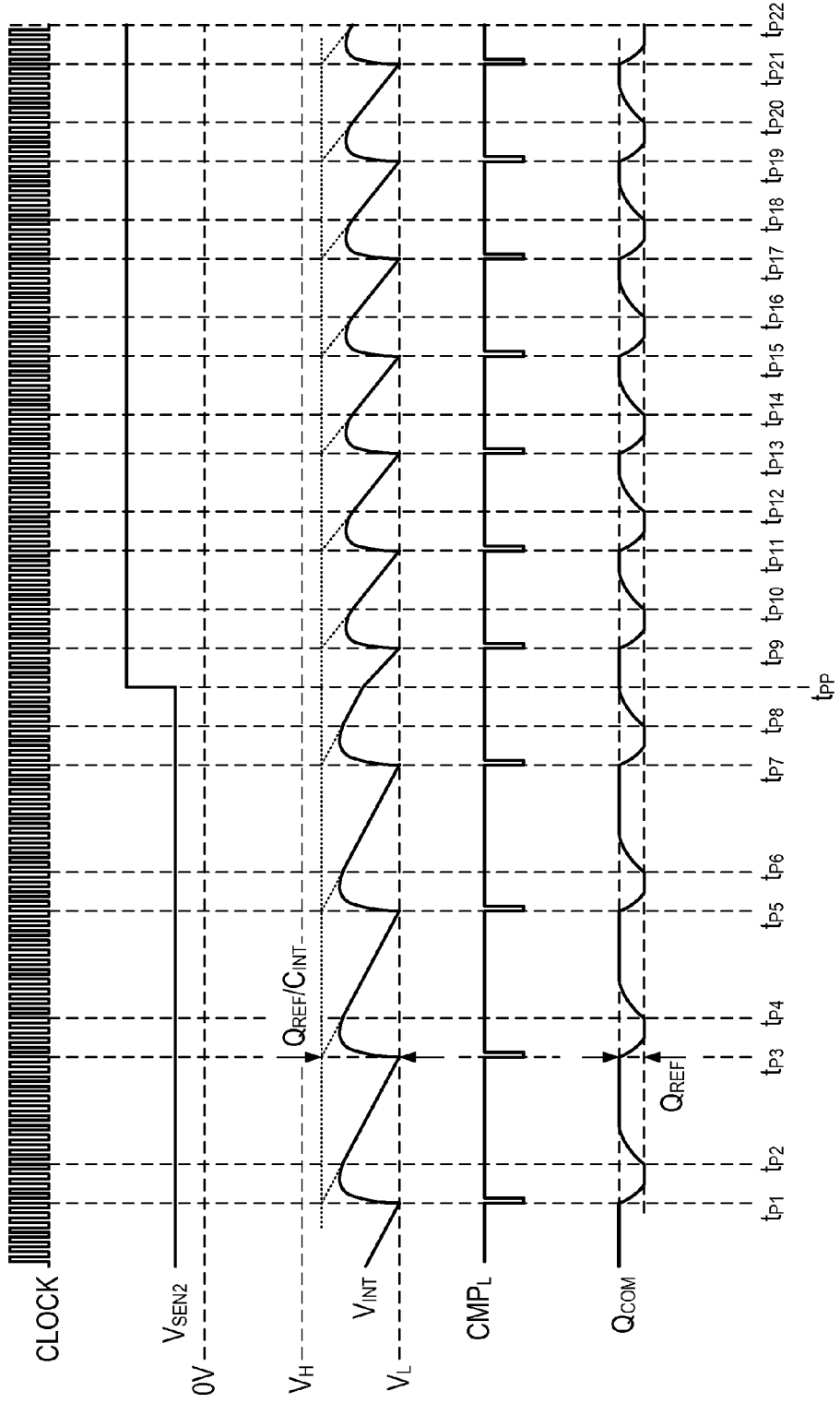
FIG. 5B illustrates examples of waveforms of signals associated with a coulomb counter, in an embodiment according to the present invention.

FIG. 5B illustrates examples of waveforms of the sense signal $V_{SEN2}$, the integral value $V_{INT}$, the trigger signal $CMP_L$, and the charge capacity $Q_{COM}$ of the capacitive component $C_{COM}$, in an embodiment according to the present invention. FIG. 5B is described in combination with FIG. 3, FIG. 4, and FIG. 5A. In the example of FIG. 5B, the sense signal $V_{SEN2}$ has a positive voltage level, and the integral value $V_{INT}$ decreases due to integration of the positive sense signal $V_{SEN2}$.

Similar to the operations described in relation to FIG. 5A, as shown in FIG. 5B, a trigger signal $CMP_L$ is generated each time the integral value $V_{INT}$ decreases to the low-side reference $V_L$. In response to each trigger signal $CMP_L$, the capacitive component $C_{COM}$ discharges to provide an amount of compensation charges $Q_{REF}$ to the integrating capacitor $C_{INT}$ to increase the integral value $V_{INT}$ by an increment $\Delta V_{INT}$, e.g., $\Delta V_{INT}=Q_{REF}/C_{INT}$. The charge capacity $Q_{COM}$ of the capacitive component $C_{COM}$ can decrease to zero. After a preset time interval $\Delta t$ from the generation of each trigger signal $CMP_L$, e.g., $\Delta t=t_{P2}-t_{P1}=t_{P4}-t_{N3}=t_{P6}-t_{P5} \ldots$, the capacitive component $C_{COM}$ is charged by the voltage source 432. The charge capacity $Q_{COM}$ of the capacitive component $C_{COM}$ can increase to $Q_{REF}$. Thus, in one embodiment, each time the integral value $V_{INT}$ decreases to the low-side reference $V_L$, the compensation circuit 330 provides the same amount of compensation charges $Q_{REF}$ to the integrating capacitor $C_{INT}$ to increase the integral value $V_{INT}$, e.g., by the same increment $Q_{REF}/C_{INT}$. In one embodiment, an integration time $T_{INT}$, e.g., $t_{P3}-t_{P1}$, $t_{P5}-t_{P3}$, etc., for integrating the sense signal $V_{SEN2}$ so that the integral value $V_{INT}$ decreases from the voltage level $V_L+Q_{REF}/C_{INT}$ to the voltage level $V_L$ can be given by: $T_{INT}=Q_{REF}*R_{INT}/V_{SEN2}$. Thus, the integration time $T_{INT}$ is inversely proportional to the sense signal $V_{SEN2}$. In other words, the trigger signals $CMP_L$ are generated at a frequency $f_{CMP}$ (e.g., $1/T_{INT}$) that is linearly proportional to the sense signal $V_{SEN2}$.

Accordingly, in one embodiment, the analog-to-frequency converting circuit, e.g., including the sense resistor $R_{SEN}$, the switches 302, the integral comparing circuit 310, the control circuit 320, and the compensation circuit 330, can sense a current $I_{SEN}$ flowing through the sense resistor $R_{SEN}$ and generate a train of trigger signals $CMP_H/CMP_L$ (e.g., a series of rising edges or a series of a falling edges) at a frequency $f_{CMP}$ indicative of (e.g., linearly proportional to) the current $I_{SEN}$.

Figure 1:
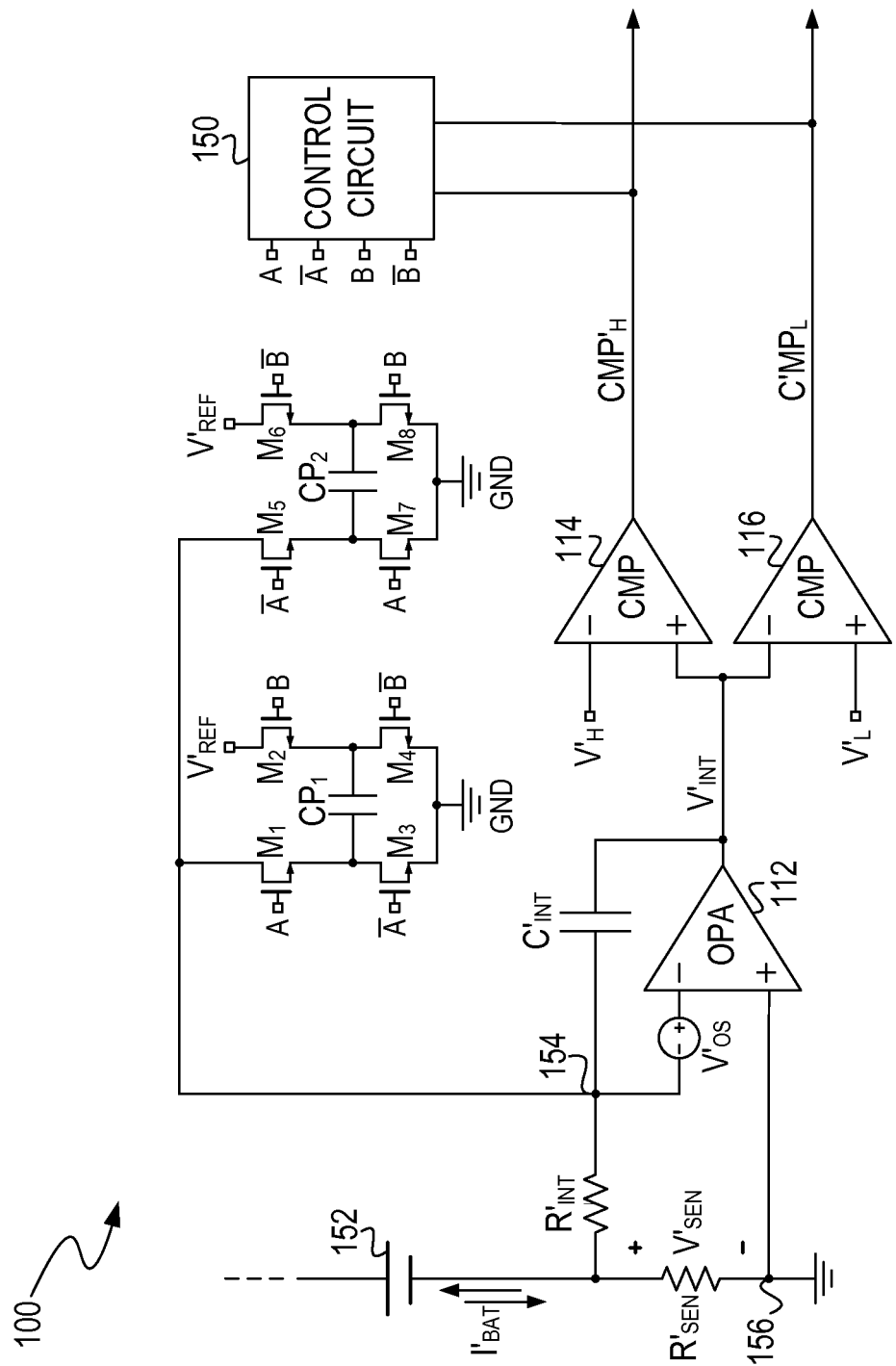
FIG. 1 illustrates a circuit diagram of a conventional voltage-to-frequency converter.
Figure 2:
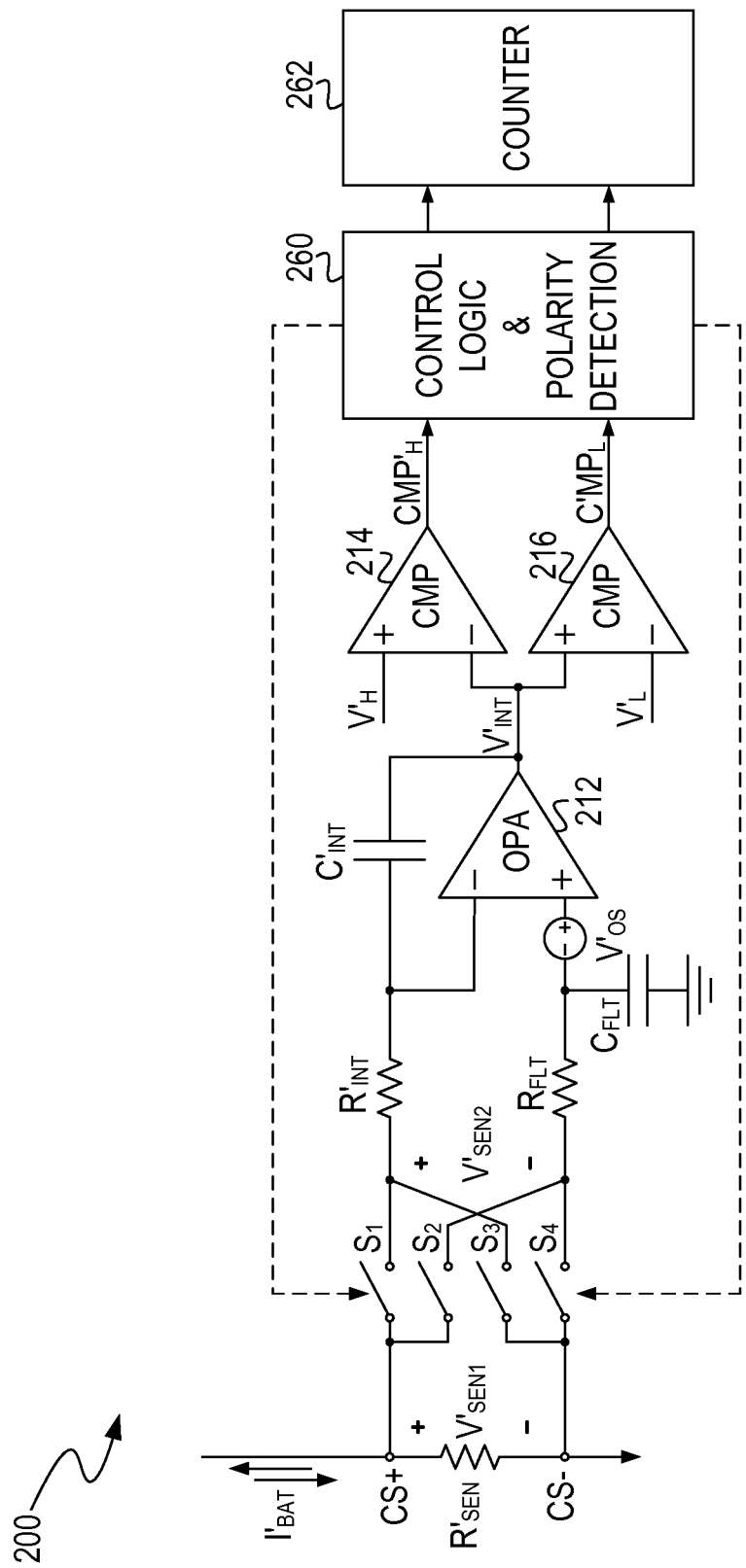
FIG. 2 illustrates a circuit diagram of a conventional coulomb counter.

Returning to FIG. 4, the capacitive component $C_{COM}$ includes a first terminal 450 and a second terminal 452 selectively coupled to a first terminal 454 of the OPA 312 and a second terminal 456 of the OPA 312 through the switches $S_{L1}$, $S_{L2}$, $S_{H1}$ and $S_{H1}$. The control circuit 320 controls the switches $S_{L1}$, $S_{L2}$, $S_{H1}$ and $S_{H1}$ such that if the first terminal 450 of the capacitive component $C_{COM}$ is coupled to the first terminal 454 of the OPA 312, then the second terminal 452 of the capacitive component $C_{COM}$ is coupled to the second terminal 456 of the OPA 312, and if the first terminal 450 of the capacitive component $C_{COM}$ is coupled to the second terminal 456 of the OPA 312, then the second terminal 452 of the capacitive component $C_{COM}$ is coupled to the first terminal 454 of the OPA 312. In other words, when the compensation circuit 330 provides compensation charges to the integral comparing circuit 310, the two terminals of the capacitive component $C_{COM}$ are coupled to the two input terminals of the OPA 312 respectively. This capacitive component $C_{COM}$ can be referred to as a "flying" or "floating" capacitor. Thus, terminals 340 and 342 of the sense resistor $R_{SEN}$, different from the terminal 156 of the sense resistor $R'_{SEN}$ in FIG. 1, can have voltage levels independent of the compensation signal $V_{COM}$, e.g., $V_{REF}$ or $-V_{REF}$, from the capacitive component $C_{COM}$. Advantageously, the sense resistor $R_{SEN}$ can be placed at a negative terminal of a battery or a positive terminal of a battery.

Although FIG. 3 and FIG. 4 disclose that the positive terminal of the battery 344 is coupled to the terminal 342 of the sense resistor $R_{SEN}$, the invention is not so limited. In another embodiment, the positive terminal of the battery 344 can be coupled to the other terminal 340 of the sense resistor $R_{SEN}$. In yet another embodiment, the negative terminal of the battery 344 can be coupled to the terminal 340 or the terminal 342 of the sense resistor $R_{SEN}$.

Additionally, in one embodiment, the compensation circuit 330 can, but not necessarily, use one capacitor $C_{COM}$ to provide compensation charges. Thus, compared with the compensation circuitry in FIG. 1 that includes two capacitors $CP_1$ and $CP_1$, the compensation circuit 330 can cost less and have a smaller size.

Moreover, in one embodiment, due to non-ideality of the comparators 314 and 316, there may be delays, e.g., $\Delta t$, in the generation of the trigger signals $CMP_H$ and $CMP_L$. With reference to FIG. 5A, in one embodiment, the trigger signals $CMP_H$ may be generated at times $t_{N1}+\Delta t$, $t_{N3}+\Delta t$, $t_{N5}+\Delta t$, etc., instead of times $t_{N1}$, $t_{N3}$, $t_{N5}$, etc., due to non-ideality of the comparator 314. In this embodiment, the delay $\Delta t$ exists each time a trigger signal $CMP_H$ is generated. Thus, the delays in generation of the trigger signals $CMP_H$ may not result in error, e.g., a decrement, in the frequency $f_{CMP}$ of the trigger signals $CMP_H$. Similarly, delays in generation of trigger signals $CMP_L$ may not result in error, e.g., a decrement, in the frequency $f_{CMP}$ of the trigger signals $CMP_L$.

Furthermore, as mentioned above, the filter circuit 436 such as a low-pass filter can buff, e.g., slow down, the flowing of the compensation charges $Q_{REF}$ from the capacitive component $C_{COM}$ to the integral comparing circuit 310, so as to reduce/smoothen the change in the integral value $V_{INT}$ caused by the compensation charges $Q_{REF}$. Thus, a current generated by the OPA 312 and through the integrating capacitor $C_{INT}$ and the capacitive component $C_{COM}$ to discharge the capacitive component $C_{COM}$ can be reduced, compared with the current generated to discharge the capacitor $CP_1$ described in relation to FIG. 1.

Returning to FIG. 3, the coulomb counter 300 also includes a logic circuit 304 and a counter 306. The counter 306 can count a number of the trigger signals $S_{FREQ}$, e.g., including signals $CMP_H$ and $CMP_L$, to generate a count value $N_{COUNT}$. The count value $N_{COUNT}$ can represent a result of integrating a current $I_{SEN}$ flowing through the sense resistor $R_{SEN}$. In one embodiment, the current $I_{SEN}$ can be a charging current or a discharging current of a battery 344. In one such embodiment, the count value $N_{COUNT}$ can represent an amount of accumulation of electric charges in the battery current $I_{SEN}$, e.g., an amount of accumulation of electric charges passing in and out of the battery 344.

In one embodiment, the OPA 312 may include an input offset $V_{OS}$, e.g., an input voltage offset, which may cause error in the frequency $f_{CMP}$ of the trigger signals $S_{FREQ}$, e.g., including signals $CMP_H$ and $CMP_L$. Advantageously, as mentioned above, the control circuit 320 can generate a switching signal $F_{CHOP}$ to control the switches 302 such that the sense signal $V_{SEN2}$ alternates between an original version of the sense signal $V_{SEN1}$ (e.g., $V_{SEN2}=V_{SEN1}$) and a reversed version of the sense signal $V_{SEN1}$ (e.g., $V_{SEN2}=-V_{SEN1}$), and that a first time interval $T_A$ during which the sense signal $V_{SEN2}$ is in the original version $V_{SEN1}$ (e.g., $V_{SEN2}=V_{SEN1}$) and a second time interval $T_B$ during which the sense signal $V_{SEN2}$ is in the reversed version $-V_{SEN1}$ (e.g., $V_{SEN2}=-V_{SEN1}$) are substantially the same. As used herein, "substantially the same" means that the time intervals $T_A$ and $T_B$ are controlled to be the same but a negligibly small difference may exist between the time intervals $T_A$ and $T_B$ due to non-ideality of the control circuit 320 and/or the switches 302. The counter 306 can count a number $\Delta N_{SUM}$ of the trigger signals $S_{FREQ}$ for the first and second time interval to generate a count value, e.g., $\Delta N_{SUM}=\Delta N_1+\Delta N_2$ where $\Delta N_1$ represents the number of the trigger signals $S_{FREQ}$ generated in the first time interval, and $\Delta N_2$ represents the number of the trigger signals $S_{FREQ}$ generated in the second time interval. For example, the counter 306 can increase the count value $N_{COUNT}$ by an increment of $\Delta N_1+\Delta N_2$ if the current $I_{SEN}$ is a charging current of the battery 344, or decrease the count value $N_{COUNT}$ by a decrement of $\Delta N_1+\Delta N_2$ if the current $I_{SEN}$ is a discharging current of the battery 344. As a result, the control circuit 320 can counteract error, caused by the input offset $V_{OS}$ of the OPA 312, in the count value $N_{COUNT}$ by controlling the first and second time intervals $T_A$ and $T_B$ to be substantially the same. More details will be described in combination with FIG. 7.

In one embodiment, the logic circuit 304 cooperates with the control circuit 320 to generate a count-direction signal $S_{D/U}$. The count-direction signal $S_{D/U}$ can represent a flowing direction of the current $I_{SEN}$, e.g., indicate whether the current $I_{SEN}$ is a charging current or a discharging current of the battery 344, and can control the counter 306 to increase or decrease the count value $N_{COUNT}$ when a trigger signal $S_{FREQ}$ is generated. More specifically, in one embodiment, the logic circuit 304 includes an XOR gate, and the control circuit 320 includes a circuit structure disclosed in FIG. 6A.

Figure 6A:
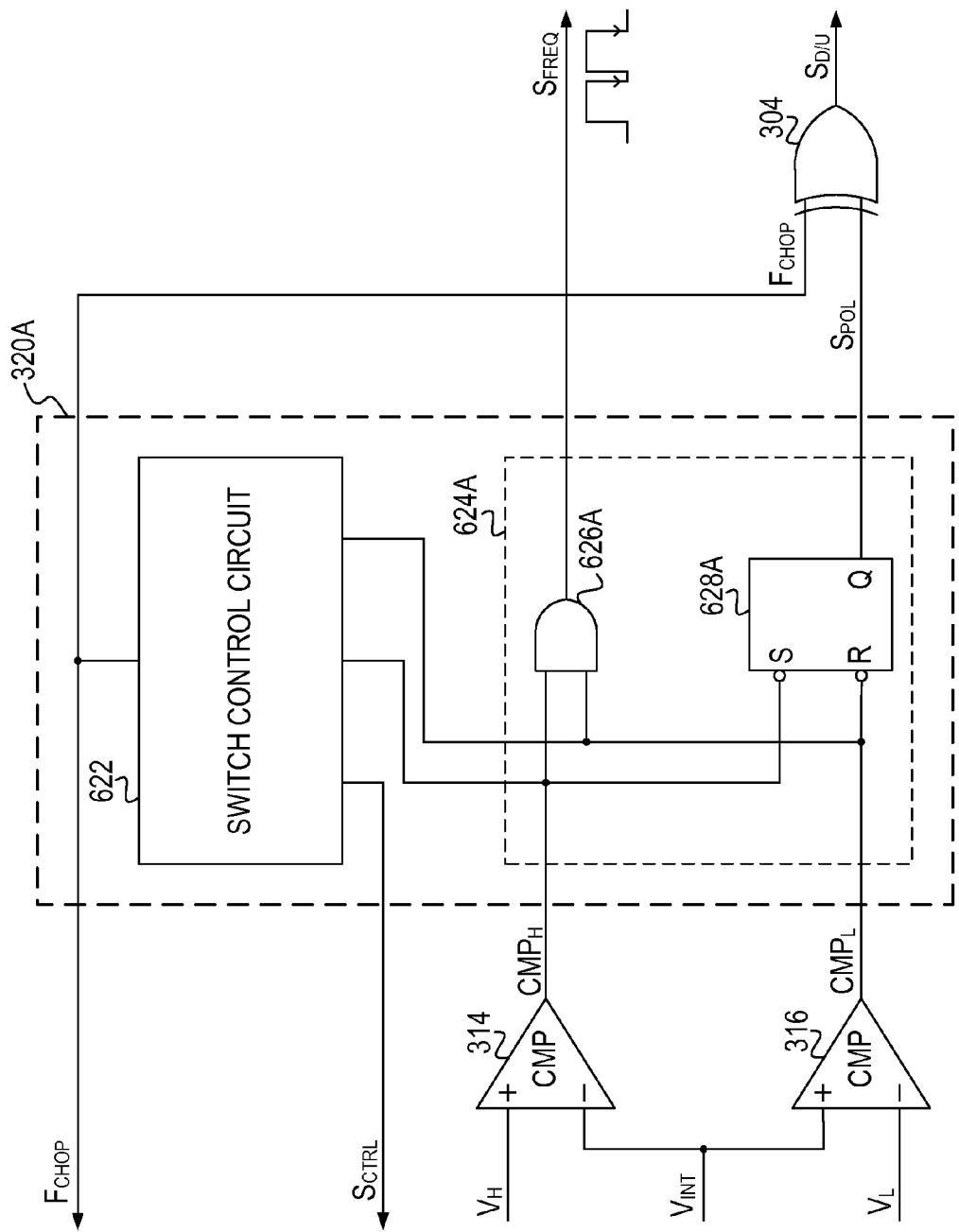
FIG. 6A illustrates a circuit diagram of an example of a control circuit, in an embodiment according to the present invention.

FIG. 6A illustrates a circuit diagram of an example of the control circuit 320, e.g., labeled 320A, in an embodiment according to the present invention. FIG. 6A is described in combination with FIG. 3 and FIG. 4. As shown in FIG. 6A, the control circuit 320A includes a switch control circuit 622 and a logic circuit 624A. The switch control circuit 622 can generate a switching signal $F_{CHOP}$ to control the switches 302, and generate one or more control signals $S_{CTRL}$ to control the compensation circuit 330, e.g., generate control signals $S_{CTRL1}$ and $S_{CTRL2}$ to control the switches 434 in FIG. 4. In one embodiment, when the switching signal $F_{CHOP}$ is in a first status, e.g., logic high (or logic low), the switches 302 can provide a sense signal $V_{SEN2}$ at the voltage level of $V_{SEN1}$ to the integral comparing circuit 310; and when the switching signal $F_{CHOP}$ is in a second status, e.g., logic low (or logic high; the opposite of the first status), the switches 302 can provide a sense signal $V_{SEN2}$ at the voltage level of $-V_{SEN1}$ to the integral comparing circuit 310. The switch control circuit 622 can control the switching signal $F_{CHOP}$ to have a 50% duty cycle such that the abovementioned first time interval $T_A$ and second time interval $T_B$ are the same.

In one embodiment, the logic circuit 624A generates a trigger signal $S_{FREQ}$ on detection of each trigger signal of the signals $CMP_H$ and $CMP_L$. By way of example, the logic circuit 624A includes an AND gate 626A coupled to the comparators 314 and 316 and operable for receiving trigger signals $CMP_H$ and $CMP_L$ from the comparators 314 and 316. In the example of FIG. 6A, the comparator 314 receives the integral value $V_{INT}$ at its inverting input terminal and receives the high-side reference $V_H$ at its non-inverting input terminal. Thus, the trigger signal $CMP_H$, representing that the integral value $V_{INT}$ has increased to the high-side reference $V_H$, is a logic-low signal, e.g., a falling edge of a signal. Similarly, the comparator 316 receives the integral value $V_{INT}$ at its non-inverting input terminal and receives the low-side reference $V_L$ at its inverting input terminal. Thus, the trigger signal $CMP_L$, representing that the integral value $V_{INT}$ has decreased to the low-side reference $V_L$, is a logic-low signal, e.g., a falling edge of a signal. The AND gate 626A can output a trigger signal $S_{FREQ}$ at logic-low when detecting a trigger signal $CMP_H$ or $CMP_L$, e.g., a logic-low signal, at its input terminals. Consequently, the trigger signals $S_{FREQ}$ represent a combination of the trigger signal $CMP_H$ and $CMP_L$ and can be considered to include the trigger signal $CMP_H$ or $CMP_L$.

In one embodiment, the logic circuit 624A cooperates with the switch control circuit 622 and the logic circuit 304 to generate a count-direction signal $S_{D/U}$. The count-direction signal $S_{D/U}$ determines whether to increase or decrease the abovementioned count value $N_{COUNT}$ when a trigger signal $S_{FREQ}$ is generated. More specifically, in one embodiment, the logic circuit 624A generates a polarity signal $S_{POL}$, sets the polarity signal $S_{POL}$ to a first logic level on detection of the trigger signal $CMP_H$, and sets the polarity signal $S_{POL}$ to a second logic level on detection of the trigger signal $CMP_L$. The first and second logic levels are different. As used herein, two logic levels are "different" if the two logic levels are inverted relative to each other. For example, if one of the logic levels is logic high, then the other one of the logic levels is logic low; and if one of the logic levels is logic low, then the other one of the logic levels is logic high. In the example of FIG. 6A, a set-reset NAND latch 628A in the logic circuit 624A can set the polarity signal $S_{POL}$ to be logic high on detection of a trigger signal $CMP_H$ at its set input terminal labeled "S", and set the polarity signal $S_{POL}$ to be logic low on detection of a trigger signal $CMP_L$ at its reset input terminal labeled "R". In one embodiment, as mentioned above, a trigger signal $CMP_H$ can be generated during a situation where the sense signal $V_{SEN2}$ is positive, and a trigger signal $CMP_L$ can be generated during a situation where the sense signal $V_{SEN2}$ is negative. Thus, the polarity signal $S_{POL}$ can represent whether the second sense signal $V_{SEN2}$ is positive or negative.

Additionally, the logic circuit 304 such as an XOR gate can set the count-direction signal $S_{D/U}$ to a third logic level if a logic level of the polarity signal $S_{POL}$ and a logic level of the switching signal $F_{CHOP}$ are the same, and set the count-direction signal $S_{D/U}$ to a fourth logic level if a logic level of the polarity signal $S_{POL}$ and a logic level of the switching signal $F_{CHOP}$ are the different. The third and fourth logic levels are different, similar to the abovementioned first and second logic levels. As used herein, two logic levels are "the same" if the two logic levels are either logic high at the same time or logic low at the same time. In the example of FIG. 6A, the logic circuit 304 can set the count-direction signal $S_{D/U}$ to be logic low if the polarity signal $S_{POL}$ and the switching signal $F_{CHOP}$ both are logic high or logic low. The logic circuit 304 can also set the count-direction signal $S_{D/U}$ to be logic high if the polarity signal $S_{POL}$ is logic high and the switching signal $F_{CHOP}$ is logic low, or if the polarity signal $S_{POL}$ is logic low and the switching signal $F_{CHOP}$ is logic high. In one embodiment, whether the polarity signal $S_{POL}$ and the switching signal $F_{CHOP}$ have the same logic level is determined by the direction the current $I_{SEN}$ is flowing through the sense resistor $R_{SEN}$ (shown in FIG. 3). Thus, the logic level of the count-direction signal $S_{D/U}$ can represent whether the current $I_{SEN}$ is a charging current or a discharging current of the battery 344, and therefore can determine whether to increase or decrease the abovementioned count value $N_{COUNT}$ when a trigger signal $S_{FREQ}$ is generated. More details are described in combination with FIG. 7.

Figure 7:
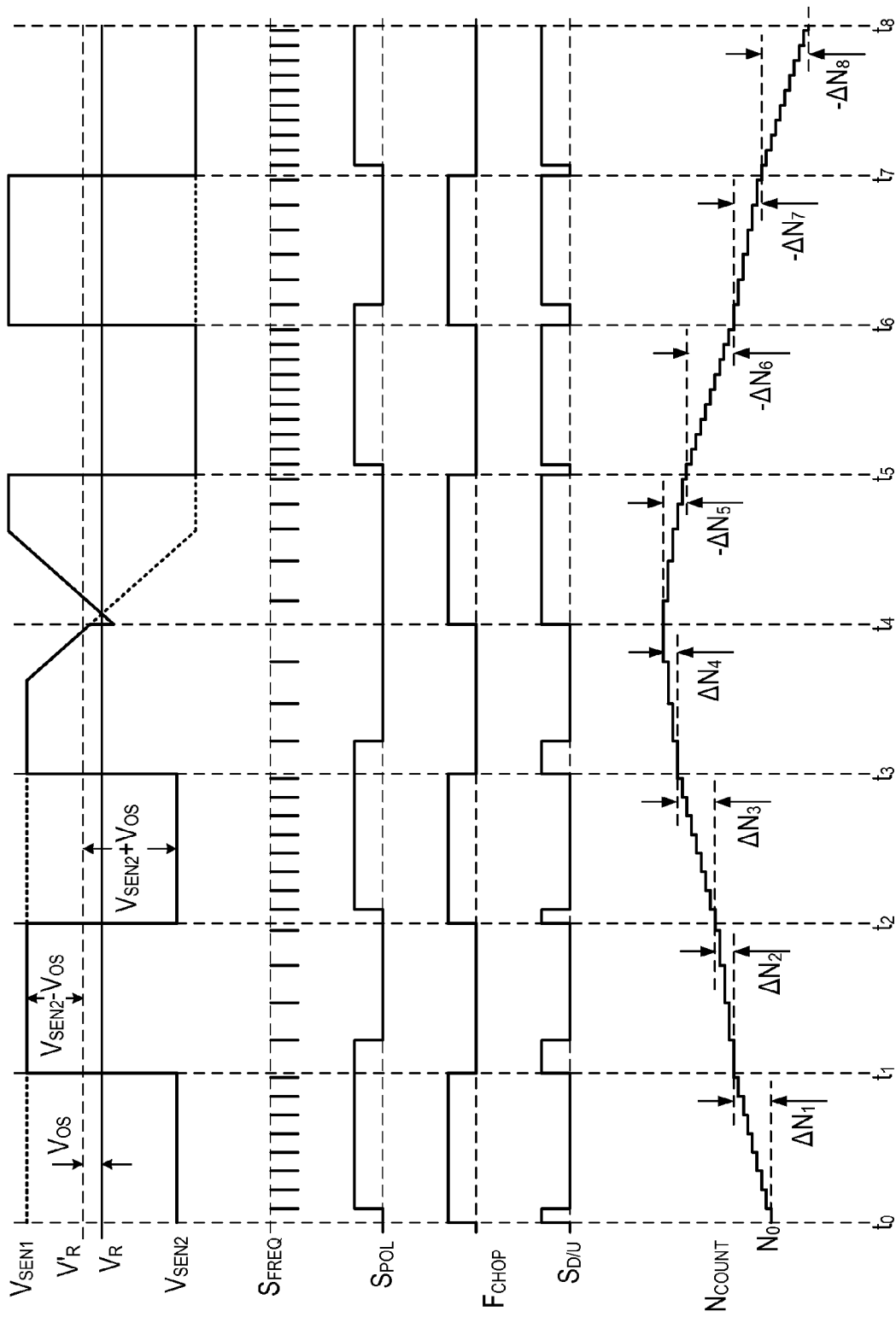
FIG. 7 illustrates examples of waveforms of signals associated with a coulomb counter, in an embodiment according to the present invention.

FIG. 7 illustrates examples of waveforms of the first sense signal $V_{SEN1}$, the second sense voltage $V_{SEN2}$, the trigger signals $S_{FREQ}$, the polarity signal $S_{POL}$, the switching signal $F_{CHOP}$, the count-direction signal $S_{D/U}$, and the count value $N_{COUNT}$, in an embodiment according to the present invention. FIG. 7 is described in combination with FIG. 3, FIG. 4, and FIG. 6A. In the example of FIG. 7, during time to and time $t_4$, the battery 344 is in a charging mode, the first sense signal $V_{SEN1}$ is positive, and the count value $N_{COUNT}$ increases in response to each trigger signal $S_{FREQ}$; and during time $t_4$ to time $t_8$, the battery 344 is in a discharging mode, the first sense signal $V_{SEN1}$ is negative, and the count value $N_{COUNT}$ decreases in response to each trigger signal $S_{FREQ}$.

In the example of FIG. 7, the control circuit 320 can turn off the switches $S_{A1}$ and $S_{A2}$ and turn on the switches $S_{B1}$ and $S_{B2}$ by setting the switching signal $F_{CHOP}$ to be logic high, and can turn off the switches $S_{B1}$ and $S_{B2}$ and turn on the switches $S_{A1}$ and $S_{A2}$ by setting the switching signal $F_{CHOP}$ to be logic low. Thus, as shown in FIG. 7, when the battery 344 is in a charging mode, e.g., from time $t_0$ to time $t_4$, the second sense voltage $V_{SEN2}$ is negative if the switching signal $F_{CHOP}$ is logic high, and is positive if the switching signal $F_{CHOP}$ is logic low. When the battery 344 is in a discharging mode, e.g., from time $t_4$ to time $t_8$, the second sense voltage $V_{SEN2}$ is positive if the switching signal $F_{CHOP}$ is logic high, and is negative if the switching signal $F_{CHOP}$ is logic low.

From time $t_0$ to time $t_1$, the switching signal $F_{CHOP}$ is logic high, and the second sense voltage $V_{SEN2}$ is negative. Hence, a set of trigger signals $CMP_H$ are generated, and the latch 628A sets the polarity signal $S_{POL}$ to be logic high accordingly. Because the polarity signal $S_{POL}$ and the switching signal $F_{CHOP}$ have the same logic level, e.g., logic high, the logic circuit 304 sets the count-direction signal $S_{D/U}$ to be logic low. Similarly, from time $t_1$ to time $t_2$, the switching signal $F_{CHOP}$ is logic low, and the second sense voltage $V_{SEN2}$ is positive. Hence, a set of trigger signals $CMP_L$ are generated, and the latch 628A sets the polarity signal $S_{POL}$ to be logic low accordingly. Because the polarity signal $S_{POL}$ and the switching signal $F_{CHOP}$ have the same logic level, e.g., logic low, the logic circuit 304 sets the count-direction signal $S_{D/U}$ to be logic low. In addition, from time $t_4$ to time $t_5$, the switching signal $F_{CHOP}$ is logic high, and the second sense voltage $V_{SEN2}$ is positive. Hence, a set of trigger signals $CMP_L$ are generated, and the latch 628A sets the polarity signal $S_{POL}$ to be logic low accordingly. Because the polarity signal $S_{POL}$ and the switching signal $F_{CHOP}$ have different logic levels, the logic circuit 304 sets the count-direction signal $S_{D/U}$ to be logic high. Similarly, from time $t_5$ to time $t_6$, the switching signal $F_{CHOP}$ is logic low, and the second sense voltage $V_{SEN2}$ is negative. Hence, a set of trigger signals $CMP_H$ are generated, and the latch 628A sets the polarity signal $S_{POL}$ to be logic high accordingly. Because the polarity signal $S_{POL}$ and the switching signal $F_{CHOP}$ have different logic levels, the logic circuit 304 sets the count-direction signal $S_{D/U}$ to be logic high. Thus, in this example of FIG. 7, the count-direction signal $S_{D/U}$ is logic low if the battery 344 is in a charging mode, and is logic high if the battery 344 is in a discharging mode. If the counter 306 detects that the count-direction signal $S_{D/U}$ is logic low, then the counter 306 increases the count value $N_{COUNT}$ in response to each trigger signal $S_{FREQ}$; and if the counter 306 detects that the count-direction signal $S_{D/U}$ is logic high, then the counter 306 decreases the count value $N_{COUNT}$ in response to each trigger signal $S_{FREQ}$.

FIG. 7 shows examples of the signals associated with the coulomb counter 300 (or 400) in one embodiment, but the invention is not limited to these examples. In another embodiment, the control circuit 320 can turn off the switches $S_{A1}$ and $S_{A2}$ and turn on the switches $S_{B1}$ and $S_{B2}$ by setting the switching signal $F_{CHOP}$ to be logic low, and can turn off the switches $S_{B1}$ and $S_{B2}$ and turn on the switches $S_{A1}$ and $S_{A2}$ by setting the switching signal $F_{CHOP}$ to be logic high. In one such embodiment, if the count-direction signal $S_{D/U}$ is logic high, then it indicates that the battery 344 is in a charging mode, and the counter 306 increases the count value $N_{COUNT}$ in response to each trigger signal $S_{FREQ}$. If the count-direction signal $S_{D/U}$ is logic low, then it indicates that the battery 344 is in a discharging mode, and the counter 306 decreases the count value $N_{COUNT}$ in response to each trigger signal $S_{FREQ}$. In yet other embodiments, the battery 344 may be coupled to the sense resistor $R_{SEN}$ in other manners, and the signals $V_{SEN1}$, $V_{SEN2}$, $S_{FREQ}$, $S_{POL}$, $F_{CHOP}$, and $S_{D/U}$ can have different waveforms accordingly.

Additionally, as mentioned above, the control circuit 320 can counteract error, caused by an input offset $V_{OS}$ of the OPA 312, in the count value $N_{COUNT}$ by controlling the first and second time intervals $T_A$ and $T_B$ to be substantially the same. Taking FIG. 7 as an example, the reference line labeled "$V_R$" represents a voltage level at the terminal 342 of the sense resistor $R_{SEN}$, and the reference line labeled "$V'_R$" represents a voltage level at the non-inverting input terminal of the OPA 312. A voltage difference, e.g., labeled "$V_{OS}$" in FIG. 7, between the voltage levels $V_R$ and $V'_R$ can represent an input offset of the OPA 312. Thus, from time $t_0$ to time $t_1$, the integral comparing circuit 310 integrates a voltage level of $-(V_{SEN1}+V_{OS})$ and generates a number $\Delta N_1$ of the trigger signals $CMP_H$. The number $\Delta N_1$ represents a result of integrating an absolute value $|V_{SEN1}+V_{OS}|$ for the time duration between to and $t_1$ (e.g., referred to as "second time interval $T_B$"). From time $t_1$ to time $t_2$, the integral comparing circuit 310 integrates a voltage level of $V_{SEN1}-V_{OS}$ and generates a number $\Delta N_2$ of the trigger signals $CMP_L$. The number $\Delta N_2$ represents a result of integrating an absolute value $|V_{SEN1}-V_{OS}|$ for the time duration between $t_1$ and $t_2$ (e.g., referred to as "first time interval $T_A$"). In one embodiment, the control circuit 320 controls the switching signal $F_{CHOP}$ to have a 50% duty cycle such that the first time interval $T_A$ and the second time interval $T_B$ are the same. Consequently, the error caused by integrating the input offset $V_{OS}$ for the first time interval $T_A$ and the error caused by integrating the input offset $V_{OS}$ for the second time interval $T_B$ can be counteracted by each other. The sum $\Delta N_{SUM}$ of the numbers $\Delta N_1$ and $\Delta N_2$ can represent a result of integrating an absolute value $|V_{SEN2}|$.

Figure 6B:
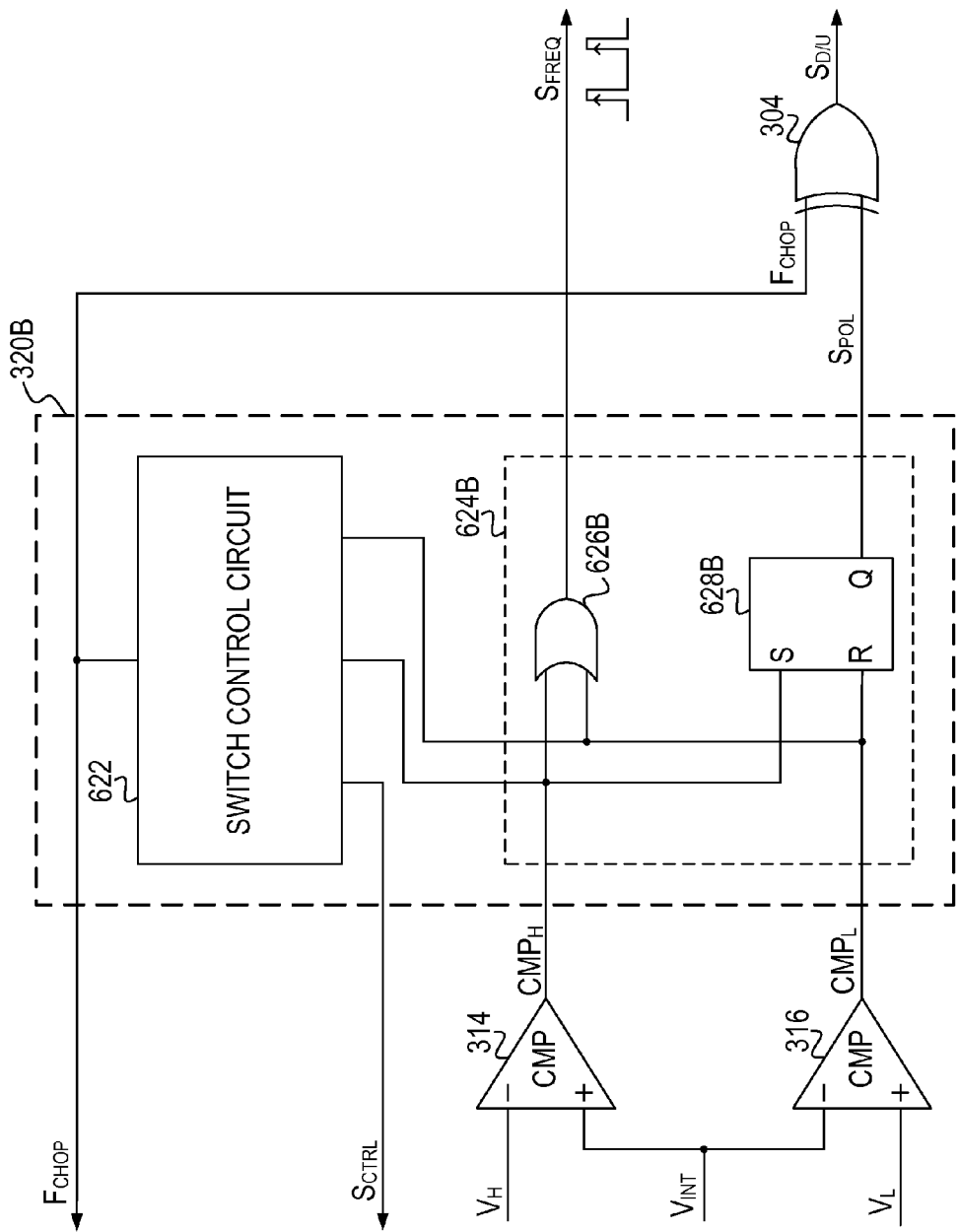
FIG. 6B illustrates a circuit diagram of an example of a control circuit, in an embodiment according to the present invention.

FIG. 6B illustrates a circuit diagram of another example of the control circuit 320, e.g., labeled 320B, in an embodiment according to the present invention. FIG. 6B is described in combination with FIG. 3, FIG. 4, and FIG. 6A. The example of FIG. 6B is similar to the example of FIG. 6A except that the comparator 314 in FIG. 6B receives the integral value $V_{INT}$ at its non-inverting input terminal and receives the high-side reference $V_H$ at its inverting input terminal, the comparator 316 receives the integral value $V_{INT}$ at its inverting input terminal and receives the low-side reference $V_L$ at its non-inverting input terminal, and the control circuit 320B includes a logic circuit 624B. In the example of FIG. 6B, trigger signals $CMP_H$ and $CMP_L$ generated by the comparators 314 and 316 are logic-high signals, e.g., rising edges. The logic circuit 624B includes an OR gate 626B and a set-reset latch 628B. The OR gate 626B can detect the trigger signals $CMP_H$ and $CMP_L$, and output a logic-high trigger signal $S_{FREQ}$ if detecting that a trigger signal $CMP_H$ or $CMP_L$ is generated. The latch 628B, similar to the latch 628A, can set the polarity signal $S_{POL}$ to a first logic level, e.g., logic high, on detection of a trigger signal $CMP_H$, and sets the polarity signal $S_{POL}$ to a second logic level, e.g., logic low, on detection of a trigger signal $CMP_L$. Similar to the example of FIG. 6A, the logic circuit 624B can cooperate with the switch control circuit 622 and the logic circuit 304 to generate a count-direction signal $S_{D/U}$, and the count-direction signal $S_{D/U}$ determines whether to increase or decrease the count value $N_{COUNT}$ when a trigger signal $S_{FREQ}$ is generated.

Although, as disclosed in FIG. 6A (and similarly disclosed in FIG. 6B), the output terminal of the compactor 314 is coupled to the set terminal of the latch 628A (or 628B), and the output terminal of the compactor 316 is coupled to the reset terminal of the latch 628A (or 628B), the invention is not so limited. In another embodiment, the output terminal of the compactor 314 can be coupled to the reset terminal of the latch 628A (or 628B), and the output terminal of the compactor 316 is coupled to the set terminal of the latch 628A (or 628B).

Returning to FIG. 3, in one embodiment, in operation, the control circuit 320 generates a switching signal $F_{CHOP}$ to control the switches 302 such that the second sense voltage $V_{SEN2}$ alternates between the voltage levels of $V_{SEN1}$ and $-V_{SEN}$. Based on the integrating of the second sense voltage $V_{SEN2}$, the comparing between the integral value $V_{INT}$ and the references $V_H$ and $V_L$, and the compensating with electric charges from the compensation circuit 330, the integral comparing circuit 310 can alternately generate a set of trigger signals $CMP_H$ and a set of trigger signals $CMP_L$. The control circuit 320 can generate a set of trigger signals $S_{FREQ}$ that present a combination of the trigger signals $CMP_H$ and $CMP_L$. The control circuit 320 can also set a polarity signal $S_{POL}$ to a first logic level when receiving a trigger signal $CMP_H$, and set the polarity signal $S_{POL}$ to a second logic level when receiving a trigger signal $CMP_L$. The logic circuit 304 can output a count-direction signal $S_{D/U}$ according to the polarity signal $S_{POL}$ and the switching signal $F_{CHOP}$. The counter 306 can count the number of the trigger signals $S_{FREQ}$ to generate a count value $N_{COUNT}$, and increase or decrease the count value $N_{COUNT}$ according to the count-direction signal $S_{D/U}$.

Figure 8:
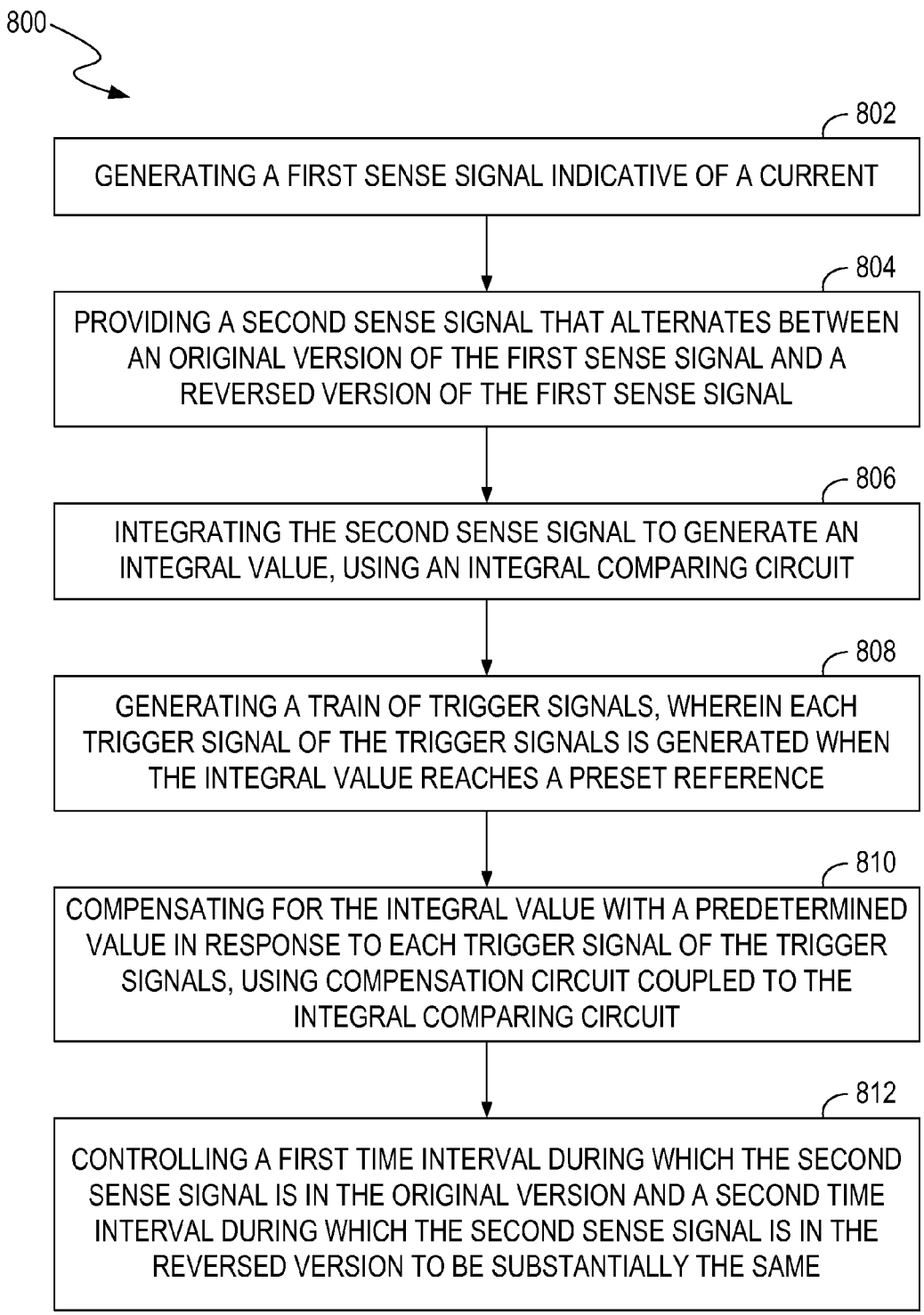
FIG. 8 illustrates a flowchart of examples of operations performed by a coulomb counter, in an embodiment according to the present invention.

FIG. 8 illustrates a flowchart 800 of examples of operations performed by a coulomb counter, e.g., 300 or 400, in an embodiment according to the present invention. FIG. 8 is described in combination with FIG. 3, FIG. 4, FIG. 5A, FIG. 5B, FIG. 6A, FIG. 6B, and FIG. 7.

In block 802, the sense resistor $R_{SEN}$ generates a first sense signal $V_{SEN1}$ indicative of a current $I_{SEN}$ flowing through the sense resistor $R_{SEN}$.

In block 804, the switches 302 provide a second sense signal $V_{SEN2}$ that alternates between an original version of the first sense signal $V_{SEN1}$ (e.g., $V_{SEN2}=V_{SEN1}$) and a reversed version of the first sense signal $V_{SEN1}$ (e.g., $V_{SEN2}=-V_{SEN1}$).

In block 806, the integral comparing circuit 310 integrates the second sense signal $V_{SEN2}$ to generate an integral value $V_{INT}$.

In block 808, the integral comparing circuit 310 generates a train of trigger signals $S_{FREQ}$, e.g., including trigger signals $CMP_H$ and $CMP_L$. Each trigger signal of the trigger signals $S_{FREQ}$ is generated when the integral value $V_{INT}$ reaches a preset reference $V_H$ or $V_L$.

In block 810, the compensation circuit 330 compensates for the integral value $V_{INT}$ with a predetermined value, e.g., $Q_{REF}/C_{INT}$, in response to each trigger signal of the trigger signals $S_{FREQ}$.

In block 812, the control circuit 320 controls a first time interval $T_A$, during which the second sense signal $V_{SEN2}$ is the original version of $V_{SEN1}$, and a second time interval $T_B$, during which the second sense signal $V_{SEN2}$ is the reversed version of $V_{SEN1}$, to be substantially the same.

In summary, embodiments according to the present invention provide analog-to-frequency converting circuits to convert an analog signal, e.g., a current of a battery, to a train of trigger signals at a frequency. By using an integral comparing circuit, compensation circuit, and control circuit in the analog-to-frequency converting circuit, in one embodiment according to the present invention, to generate the trigger signals, the frequency of the trigger signals can be linearly proportional to the current of the battery. A coulomb counter can count the trigger signals to generate a count value, and the count value can represent an accumulation of charges passing in and out of the battery. In one embodiment, by controlling the abovementioned first time interval $T_A$ and second time interval $T_B$ to be substantially the same, error in the count value caused by an input offset of the integral comparing circuit can be eliminated. The analog-to-frequency converting circuit can be used for coulomb counting in many applications such as battery monitoring and battery management in various portable electronic devices, e.g., mobile phones, cameras, laptop computers, tablet computers, GPS navigation devices, etc. The analog-to-frequency converting circuit can also be used in other situations in which an analog signal is needed to be converted to a frequency signal to indicate the analog signal.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An analog-to-frequency converting circuit comprising:
a first plurality of switches operable for receiving a first sense signal indicative of a current and providing a second sense signal that alternates between an original version of said first sense signal and a reversed version of said first sense signal, under control of a switching signal;
an integral comparing circuit, coupled to said first plurality of switches, operable for integrating said second sense signal to generate an integral value, and operable for generating a train of trigger signals at a frequency indicative of said current, wherein each trigger signal of said trigger signals is generated when said integral value reaches a preset reference;
a compensation circuit, coupled to said integral comparing circuit, operable for compensating for said integral value with a predetermined value in response to each trigger signal of said trigger signals, wherein said compensation circuit comprises:
a capacitive component; and
a second plurality of switches, coupled to said capacitive component, operable for selectively connecting a voltage source to said capacitive component to charge said capacitive component so that said capacitive component has a voltage level of said voltage source, and selectively connecting said capacitive component to said integral comparing circuit so that said compensation circuit provides a compensation signal to compensate for said integral value, wherein said control circuit controls said second plurality of switches according to said trigger signals such that said compensation signal is selectively at said voltage level and a reversed level of said voltage level; and
a control circuit, coupled to said first plurality of switches, operable for generating said switching signal such that a first time interval during which said second sense signal is said original version and a second time interval during which said second sense signal is said reversed version have substantially the same time length.

2. The analog-to-frequency converting circuit of claim 1, wherein said control circuit counteracts error, caused by an input offset of said integral comparing circuit, in a count value by controlling said first and second time intervals to be substantially the same, and wherein said count value is obtained by counting a number of said trigger signals and represents an amount of accumulation of electric charges in said current.

3. The analog-to-frequency converting circuit of claim 1, wherein said integral comparing circuit comprises:
   comparator circuitry operable for comparing said integral value with a first reference and a second reference that is less than said first reference, generating a first trigger signal if said integral value is greater than said first reference, and generating a second trigger signal if said integral value is less than said second reference, wherein said preset reference is one of said first and second references.

4. The analog-to-frequency converting circuit of claim 3, wherein if said first trigger signal is generated, then said compensation circuit provides compensation charges in a predetermined amount to said integral comparing circuit to decrease said integral value by a predetermined value, and wherein if said second trigger signal is generated, then said compensation circuit provides compensation charges in said predetermined amount to said integral comparing circuit to increase said integral value by a predetermined value.

5. The analog-to-frequency converting circuit of claim 1, wherein said capacitive component comprises a first terminal and a second terminal selectively coupled to a first terminal of said integral comparing circuit and a second terminal of said integral comparing circuit through said second plurality of switches, and wherein said control circuit controls said second plurality of switches such that if said first terminal of said capacitive component is coupled to said first terminal of said integral comparing circuit, then said second terminal of said capacitive component is coupled to said second terminal of said integral comparing circuit, and such that if said first terminal of said capacitive component is coupled to said second terminal of said integral comparing circuit, then said second terminal of said capacitive component is coupled to said first terminal of said integral comparing circuit.

6. The analog-to-frequency converting circuit of claim 1, wherein said compensation circuit comprises a filter circuit operable for passing compensation charges from said compensation circuit to said integral comparing circuit to change said integral value and reducing a change in said integral value caused by said compensation charges.

7. A coulomb counter comprising:
   an analog-to-frequency converting circuit operable for converting a current to a train of trigger signals at a frequency indicative of said current, said analog-to-frequency converting circuit comprising:
      a first plurality of switches operable for receiving a first sense signal indicative of said current and providing a second sense signal that alternates between an original version of said first sense signal and a reversed version of said first sense signal, under control of a switching signal;
      an integral comparing circuit, coupled to said first plurality of switches, operable for integrating said second sense signal to generate an integral value, and operable for generating a trigger signal of said trigger signals when said integral value reaches a preset reference;
      a compensation circuit, coupled to said integral comparing circuit, operable for compensating for said integral value with a predetermined value in response to each trigger signal of said trigger signals, wherein said compensation circuit comprises:
         a capacitive component; and
         a second plurality of switches, coupled to said capacitive component, operable for selectively connecting a voltage source to said capacitive component to charge said capacitive component so that said capacitive component has a voltage level of said voltage source, and selectively connecting said capacitive component to said integral comparing circuit so that said compensation circuit provides a compensation signal to compensate for said integral value, wherein said control circuit controls said second plurality of switches according to said trigger signals such that said compensation signal is selectively at said voltage level and a reversed level of said voltage level; and
      a control circuit, coupled to said first plurality of switches, operable for generating said switching signal such that a first time interval during which said second sense signal is said original version and a second time interval during which said second sense signal is said reversed version have substantially the same time length; and
   a counter, coupled to said analog-to-frequency converting circuit, operable for counting a number of said trigger signals to generate a count value representing an amount of accumulation of electric charges in said current.

8. The coulomb counter of claim 7, wherein said control circuit counteracts error, caused by an input offset of said integral comparing circuit, in said count value by controlling said first and second time intervals to be substantially the same.

9. The coulomb counter of claim 7, wherein said integral comparing circuit comprises:
   comparator circuitry operable for comparing said integral value with a first reference and a second reference that is less than said first reference, generating a first trigger signal if said integral value is greater than said first reference, and generating a second trigger signal if said integral value is less than said second reference, wherein said preset reference is one of said first and second references.

10. The coulomb counter of claim 9, further comprising:
    a first logic circuit, coupled to said comparator circuitry, operable for generating a polarity signal, setting said polarity signal to a first logic level on detection of said first trigger signal, and setting said polarity signal to a second logic level on detection of said second trigger signal, wherein said first and second logic levels are different; and
    a second logic circuit, coupled to said first logic circuit and said control circuit, operable for generating a count-direction signal, setting said count-direction signal to a third logic level if a logic level of said polarity signal and a logic level of said switching signal are the same, and setting said count-direction signal to a fourth logic level if a logic level of said polarity signal and a logic level of said switching signal are different, wherein said third and fourth logic levels are different, and wherein said count-direction signal controls said counter to increase or decrease said count value when a trigger signal of said trigger signals is generated.

11. The coulomb counter of claim 9, wherein if said first trigger signal is generated, then said compensation circuit provides compensation charges in a predetermined amount to said integral comparing circuit to decrease said integral value by a predetermined value, and wherein if said second trigger signal is generated, then said compensation circuit provides compensation charges in said predetermined amount to said integral comparing circuit to increase said integral value by a predetermined value.

12. A method comprising:
generating a first sense signal indicative of a current;
providing a second sense signal that alternates between an original version of said first sense signal and a reversed version of said first sense signal;
integrating said second sense signal to generate an integral value;
generating a train of trigger signals, wherein each trigger signal of said trigger signals is generated when said integral value reaches a preset reference;
compensating for said integral value with a predetermined value in response to each trigger signal of said trigger signals, wherein said compensating comprises:
selectively connecting a voltage source to a capacitive component in a compensation circuit that performs said compensating, to charge said capacitive component so that said capacitive component has a voltage level of said voltage source;
selectively connecting said capacitive component to an integral comparing circuit that performs said integrating, so that said compensation circuit provides a compensation signal to compensate for said integral value; and
controlling said compensation signal to be selectively at said voltage level and a reversed level of said voltage level according to said trigger signals; and
controlling a first time interval during which said second sense signal is said original version and a second time interval during which said second sense signal is said reversed version to have substantially the same time length.

13. The method of claim 12, further comprising:
generating said trigger signals at a frequency indicative of said current.

14. The method of claim 12, further comprising:
counting a number of said trigger signals to generate a count value representing an amount of accumulation of electric charges in said current.

15. The method of claim 12, further comprising:
comparing said integral value with a first reference and a second reference that is less than said first reference;
generating a first trigger signal if said integral value is greater than said first reference; and
generating a second trigger signal if said integral value is less than said second reference,
wherein said preset reference is one of said first and second references.

16. The method of claim 15, further comprising:
setting a polarity signal to a first logic level on detection of said first trigger signal;
setting said polarity signal to a second logic level on detection of said second trigger signal, wherein said first and second logic levels are different;
setting a count-direction signal to a third logic level if a logic level of said polarity signal and a logic level of said switching signal are the same;
setting said count-direction signal to a fourth logic level if a logic level of said polarity signal and a logic level of said switching signal are different, wherein said third and fourth logic levels are different; and
controlling said counter to increase or decrease said count value when a trigger signal of said trigger signals is generated, according to said count-direction signal.

17. The method of claim 15, wherein said compensating comprises:
providing compensation charges in a predetermined amount to said integral comparing circuit to decrease said integral value by a predetermined value if said first trigger signal is generated; and
providing compensation charges in said predetermined amount to said integral comparing circuit to increase said integral value by a predetermined value if said second trigger signal is generated.

* * * * *